United States Patent [19]

Azuma

[11] Patent Number: 5,528,124
[45] Date of Patent: Jun. 18, 1996

[54] PHASE CONTROL CIRCUIT HAVING A PLURALITY OF DIFFERENTIAL CIRCUITS

[75] Inventor: Kunihiko Azuma, Tokyo, Japan

[73] Assignee: NEC Corporation, Japan

[21] Appl. No.: 408,904

[22] Filed: Mar. 22, 1995

[30] Foreign Application Priority Data

Mar. 24, 1994 [JP] Japan ..................................... 6-053428

[51] Int. Cl.⁶ ...................................................... G05F 1/00
[52] U.S. Cl. ............................................ 323/217; 323/212
[58] Field of Search .................................... 323/212, 217, 323/312, 315; 330/288, 295

[56] References Cited

U.S. PATENT DOCUMENTS

| 3,789,291 | 7/1974 | Dinger et al. | 323/217 |
| 4,663,583 | 5/1987 | Ludwick et al. | 323/217 |
| 4,792,744 | 12/1988 | Antoine | 323/217 |

OTHER PUBLICATIONS

Handbook of Semiconductor (second edition) published Jun. 30, 1981 pp. 831–835 FIGS. 11.53 11.54 11.55.

*Primary Examiner*—Matthew V. Nyugen
*Attorney, Agent, or Firm*—Hayes, Soloway, Hennessey, Grossman & Hage

[57] ABSTRACT

A phase control circuit for operating a phase shift in accordance with a control voltage comprises four differential circuits, two of which form a multiplier circuit for providing a basic function for a phase shift operation of the phase control circuit, and the rest of which cancel variations in amplitude generated during the phase shift operation. The amplitude compensation is accomplished by a construction in which a ratio of an emitter area of a first bipolar transistor in each of the differential circuits to an emitter area of the second bipolar transistor in each of the differential circuits is set at a value between 2 and 3. Alternatively, the amplitude compensation is provided by a level shift circuit providing an offset voltage in the control voltage supplied to two of the differential circuits.

13 Claims, 15 Drawing Sheets

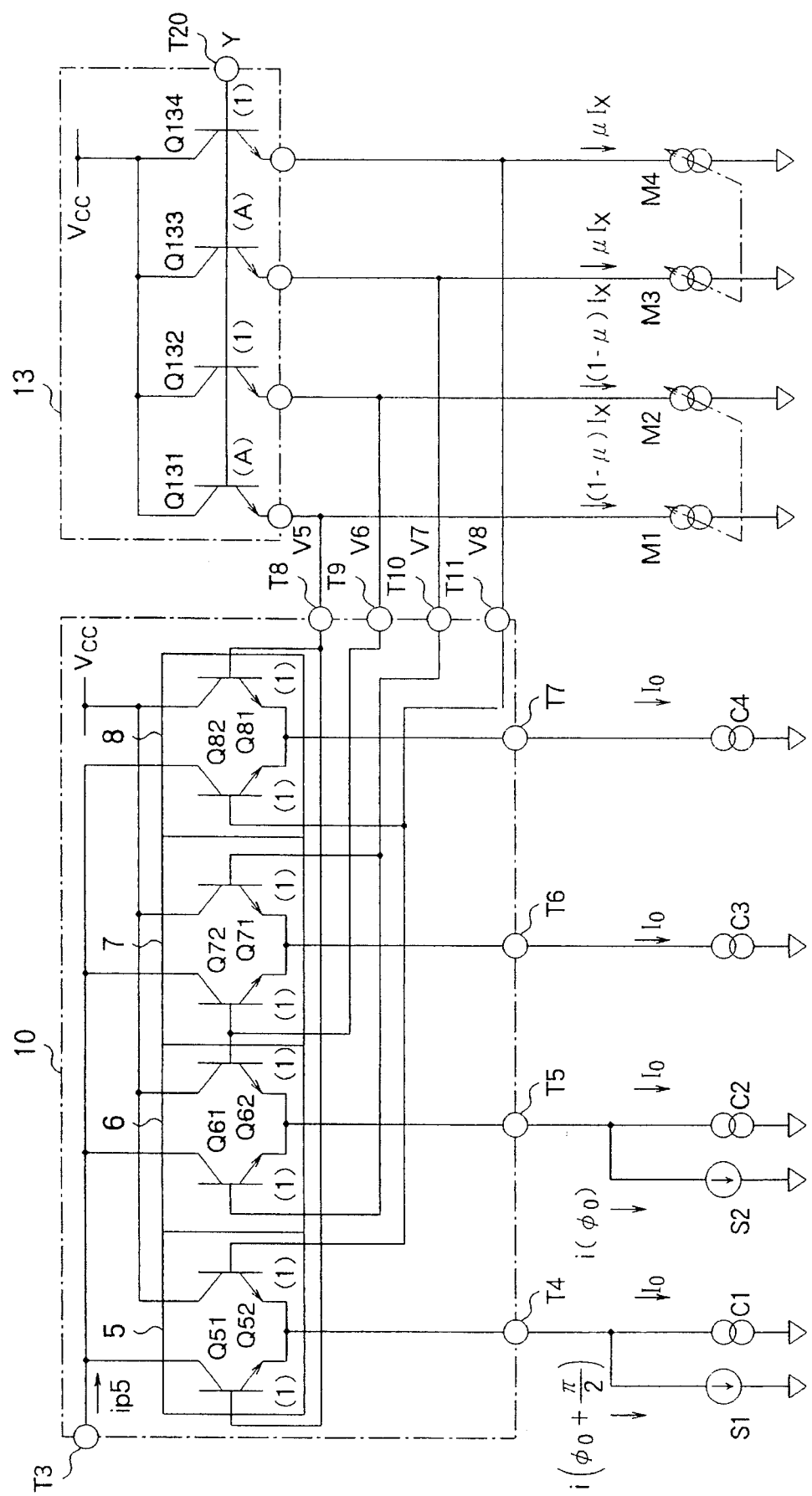

1

PHASE CONTROL CIRCUIT HAVING A PLURALITY OF DIFFERENTIAL CIRCUITS

BACKGROUND OF THE INVENTION

1. Field of the Invention

The present invention relates to a phase control circuit and, more particularly, to a phase control circuit using an analog multiplier.

2. Description of Related Art

Analog multipliers are circuit blocks which output the product of two input signals. An analog multiplier which performs a multiplication of input signals including their polarities is called a "four-quadrant multiplier". Analog multipliers can be used not only for multiplication, but also for squaring, for division, and for producing square roots. Also, when an analog multiplier performs nonlinear multiplication, it functions as a balanced modulator. Since analog multipliers have a wide range of applications, many integrated circuits including analog amplifiers, such as high-frequency modulation/demodulation circuits, have been manufactured.

As an example of a major application of an analog multiplier, a phase control circuit will be described. A phase control circuit receives two input signals having a $\pi/2$ phase difference therebetween and a control signal to generate an output signal having a different phase which varies in accordance with the control signal. This type of phase control circuit is used in various circuits such as a circuit for processing a chrominance signal in a picture signal which is utilized in a color television.

A conventional phase control circuit utilizing an analog multiplier is shown in FIG. 1. The phase control circuit includes differential circuits 5 and 6 which are formed by pairs of transistors Q51 and Q52 and transistors Q61 and Q62, respectively. Each pair of transistors Q51 and Q52 and transistors Q61 and Q62 has emitter areas identical to each other. The emitters of transistors Q51 and Q52 are connected with each other and connected, through a terminal T4, to a constant current source C1 which supplies constant current $I_o$, while the emitters of transistors Q61 and Q62 are connected with each other and connected, through a terminal T5, to a constant current source C2 which also supplies constant current $I_o$. Signal sources S1 and S2 are connected to terminals T4 and T5 to supply the differential circuits 5 and 6 with input signals $i(\phi_o+\pi/2)$ and $i(\phi_o)$, which have a phase difference of $\pi/2$ therebetween. In this text and accompanying drawings, $i(\phi_o)$ and $i(\phi_o+\pi/2)$ are meant by current signals having a phase $\phi_o$ and $\phi_o+\pi/2$, respectively.

The bases of transistors Q51 and Q62 are connected with each other and to a control terminal T1, while the bases of transistors Q52 and Q61 are connected with each other and to a control terminal T2. The collectors of transistors Q51 and Q61 are connected with each other and to an output terminal T3, while the collectors of transistors Q52 and Q62 are connected with each other and to a power supply line VCC.

In operation, a control voltage E is input between control terminals T1 and T2. In differential circuit 5, the base voltage of transistor Q51 with respect to the base voltage of transistor Q52 is equal to the control voltage E. In differential circuit 6, the base voltage of transistor Q61 with respect to the base voltage of transistor Q62 is equal to an inverted control voltage −E which is an inversion of the control voltage E. Assuming that base-to-emitter voltages of transistors Q51, Q52, Q61 and Q62 are $V_{BE51}$, $V_{BE52}$, $V_{BE61}$ and $V_{BE62}$, respectively, equations $$E=V_{BE51}-V_{BE52}, \text{ and } -E=V_{BE61}-V_{BE62}$$

hold, because the emitter voltages of transistors Q51 and Q52 of differential circuit 5 are equal to each other, and the emitter voltages of transistor Q61 and Q62 of differential circuit 6 are equal to each other.

Assuming that the emitter currents and saturation currents of the base-emitter junctions of transistors Q51, Q52, Q61 and Q62 are $I_{E51}$, $I_{E52}$, $I_{E61}$ and $I_{E62}$, and $I_{S51}$, $I_{S52}$, $I_{S61}$ and $I_{S62}$, respectively, the base-to-emitter voltages $V_{BE51}$, $V_{BE52}$, $V_{BE61}$ and $V_{BE62}$ are represented by the following equations:

$$V_{BE51}=(KT/q)\cdot ln(I_{E51}/I_{S51}),$$

$$V_{BE52}=(KT/q)\cdot ln(I_{E52}/I_{S52}),$$

$$V_{BE61}=(KT/q)\cdot ln(I_{E61}/I_{S61}),$$

$$V_{BE62}=(KT/q)\cdot ln(I_{E62}/I_{S62}),$$

wherein T is an absolute temperature, K is Boltzmann's constant, and q is electron charge.

By using these equations, equations for the control voltage E and for the inverted control voltage −E can be rewritten as follows:

$$E=(KT/q)\cdot ln(I_{E51}\cdot I_{S52}/I_{E52}\cdot I_{S51}), \quad (1)$$

$$-E=(KT/q)\cdot ln(I_{E61}\cdot I_{S62}/I_{E62}\cdot I_{S61}). \quad (2)$$

Since transistors Q51 and Q52 in the differential circuit 5, as well as transistors Q61 and Q62 in the differential circuit 6 have identical emitter areas to each other, and the saturation currents of the base-emitter junctions of these transistors are proportional to the emitter areas, $I_{S51}$ is equal to $I_{S52}$ while $I_{S61}$ is equal to $I_{S62}$. Substituting these relationships into equations (1) and (2), the following equations are obtained:

$$E=(KT/q)\cdot ln(I_{E51}/I_{E52}),$$

$$-E=(KT/q)\cdot ln(I_{E61}/I_{E62}).$$

By rearranging these equations, the following equations are obtained:

$$I_{E51}=(\tfrac{1}{2})\{1+\tanh(qE/2KT)\}(I_{E51}+I_{E52}), \quad (3)$$

$$I_{E61}=(\tfrac{1}{2})\{1-\tanh(qE/2KT)\}(I_{E61}+I_{E62}). \quad (4)$$

Assuming that common-base current amplification factors of transistors Q51 and Q61 are both $\alpha$, the collector currents of transistors Q51 and Q61 are represented by $\alpha I_{E51}$ and $\alpha I_{E61}$, respectively. Since the collectors of transistors Q51 and Q61 are both connected to output terminal T3, output current ip flowing through terminal T3 is the sum of the collector currents of transistors Q51 and Q61 and is represented by the following equation:

$$ip=(\alpha/2)\{1+\tanh(qE/2KT)\}(I_{E51}+I_{E52})+(\alpha/2)\{1-\tanh(qE/2KT)\}(I_{E61}+I_{E62}). \quad (5)$$

Input currents of the differential circuits 5 and 6, which are the sum of the emitter currents of transistors Q51 and Q52 ($I_{E51}+I_{E52}$) and the sum of the emitter currents of transistors Q61 and Q62 ($I_{E61}+I_{E62}$), respectively, are equal to the sum of currents output from signal source S1 and constant current source C1 and the sum of currents output from signal source S2 and constant current source C2, respectively.

Signal s1 ($=i(\phi_o+\pi/2)$) and signal s2 ($=i(\phi_o)$) output from signal source S1 and S2 are represented by the following equations:

$$s1 = i(\phi_o+\pi/2) = i_o \sin\{\phi_o+\pi/2\} = i_o \cos\phi_o, \quad (6)$$

$$s2 = i(\phi_o) = i_o \sin\phi_o. \quad (7)$$

Using these equations (6) and (7) and the output current $I_o$ of the constant current sources C1 and C2, equation (5) can be rewritten to obtain the following equation:

$$ip = \alpha i_o \cdot (1/\sqrt{2}) \cdot \sqrt{1+\tanh^2(qE/2KT)} \sin[\phi_o + \tan^{-1}\{\tanh(qE/2KT)\} + \pi/4] + \alpha I_o. \quad (8)$$

Equation (8) is composed of a first term of $i_o$ and a second term of $I_o$. The first term of $i_o$ represents the signal component sp of the output current ip, the signal component sp having a phase component sP and an amplitude component sA. When the first term is compared to signal s1 from signal source S1, the amplitude component sA of the output current ip is $\alpha \cdot (1/\sqrt{2}) \cdot \sqrt{1+\tanh^2(qE/2KT)}$ times as large as $i_o$, and the phase component sP has a relative value of $+\tan^{-1}\{\tanh(qE/2KT)\}+\pi/4$. Accordingly, in the conventional phase control circuit, the amount of phase shift of the output current ip can be varied, together with variation of the amplitude, in accordance with the control voltage E. The second term ($\alpha I_o$) represents a DC component of the output current ip, which remains constant regardless of variation of the control voltage E.

Variations in the amplitude and the amount of phase shift of the signal component of output signal ip with respect to variation of the control voltage E will be described in more detail. To clarify the description, an assumption is made that the control voltage E varies in the range $-\infty<E<+\infty$.

As is apparent from equation (8), the amplitude component sA ($sA=(1/\sqrt{2})\cdot\sqrt{1+\tanh^2(qE/2KT)}$) and the phase component sP ($sP=\tan^{-1}\{\tanh(qE/2KT)\}$) of output signal ip include a common parameter X expressed by the following function:

$$X = \tanh(qE/2KT) \quad (9)$$

This is an odd function of E and a monotonously increasing function of E because of the relationship $q/2KT>0$.

Moreover, since the value of $\tanh(qE/2KT)$ remains in the range of $-1<\tanh(qE/2KT)<1$, control voltage E in the range of $-\infty<E<+\infty$ has one-to-one correspondence to a bounded variation of parameter X in the range of $-1<X<1$. In other words, variations in the amplitude and the phase of the signal component of the output signal expressed in terms of parameter X which varies in the range of $-1<X<1$ equivalently represent actual variations of the amplitude and the phase when the control voltage E is varied in the range of $-\infty<E<+\infty$. Accordingly, for the purpose of simplicity, the amplitude and the phase of the signal component of the output signal will be shown as a function of parameter X represented by equation (9). Further, when necessary, E will be obtained through a reverse conversion of equation (9), i.e., by the following equation:

$$E = (2KT/q) \cdot \tanh^{-1} X. \quad (10)$$

Now, functions $f_1(X)$, $\phi_1(X)$ are defined as follows:

$$f_1(X) = (1/\sqrt{2}) \cdot \sqrt{1+X^2}, \quad (11)$$

$$\phi_1(X) = \tan^{-1} X + \pi/4. \quad (12)$$

By substituting equations (11) and (12) into equation (8), the following equation is obtained:

$$ip = \alpha i_o \cdot f_1(X) \cdot \sin\{\phi_o+\phi_1(X)\} + \alpha I_o, \quad (13)$$

wherein $f_1(X)$, $\phi_1(X)$ respectively correspond to the amplitude component sA and the phase component sP of signal component.

FIG. 2 is a graph showing functions of $f_1(X)$ and $\phi_1(X)$ defined above. As apparent from FIG. 2, $\phi_1(X)=0$ when parameter $X=-1$, and monotonously increases as X increases to reach $\pi/2$ when parameter $X=+1$. Function $f_1(X)$ assumes 1 when parameter $X=-1$ or $+1$, and assumes $1/\sqrt{2}$ when $X=0$. Accordingly, the l.u.b. (least upper bound) $f_1(X)$ and the g.l.b. (greatest lower bound) $f_1(X)$ of $f_1(X)$ are represented as follows:

$$l.u.b.\ f_1(X) = 1, \quad (14)$$

$$g.l.b.\ f_1(X) = 1/\sqrt{2}. \quad (15)$$

Values for E which have one-to-one correspondence to the values for the parameter X can be obtained from equation (10), as by:

$$E \to +\infty (X \to +1),$$

$$E = 0 \ (X=0),$$

$$E \to -\infty (X \to -1).$$

As is apparent from the foregoing description, values for each of $\phi_1(X)$ and $f_1(X)$ have one-to-one correspondence to values for E. The phase component sP of output signal ip, i.e., the amount of phase shift increases from zero to $\pi/2$ when the control voltage E increases from $-\infty$ to $+\infty$. Also, the amplitude component sA varies together with the variation of the phase component so that it assumes 1 when E approaches $-\infty$ or $+\infty$ and assumes $1/\sqrt{2}$ when $E=0$. Namely, the amplitude component sA goes down to a value corresponding to $1/\sqrt{2}$ times the upper limit value at the time when E approaches $-\infty$ or $+\infty$. Moreover, the amount of phase shift assumes $\pi/4$ at that time.

The conventional phase control circuit has a drawback that the amplitude of an output signal significantly varies to produce a $\sqrt{2}$-fold variation within the entire variable range of the phase of the output signal.

SUMMARY OF THE INVENTION

In view of the foregoing, it is an object of the present invention to provide an improved phase control circuit which reduces variation in the amplitude of an output signal, which would otherwise occur due to control of the phase shift of the output signal, substantially without an increase of the size of the phase control circuit.

In accordance with the present invention, there is provided a phase control circuit comprising: a first through a fourth differential circuits each having a first and a second transistors, each of the first and second transistors having an emitter, a collector and a base, the emitter of the first transistor and the emitter of the second transistor in each of the differential circuits are coupled together to form a coupled emitter pair; a first and a fourth current nodes, each connected to the coupled emitter pair of corresponding one of the first through fourth differential circuits, for receiving a first through fourth current inputs; a first pair of control lines for supplying a first control signal between the base of the first transistor and the base of second transistor in each of the first and fourth differential circuits; a second pair of control lines for supplying a second control signal between the base of the first transistor and the base of second transistor in each of the second and third differential circuits; and a first output node connected to the collector of each the first transistor.

BRIEF DESCRIPTION OF THE DRAWINGS

The above and other objects, features and advantages of the present invention will be more apparent from the following description, referring to the accompanying drawings in which:

FIG. 15 is a circuit diagram showing a phase control circuit according to an eighth embodiment of the present invention.

DESCRIPTION OF THE PREFERRED EMBODIMENT

Figure 1:
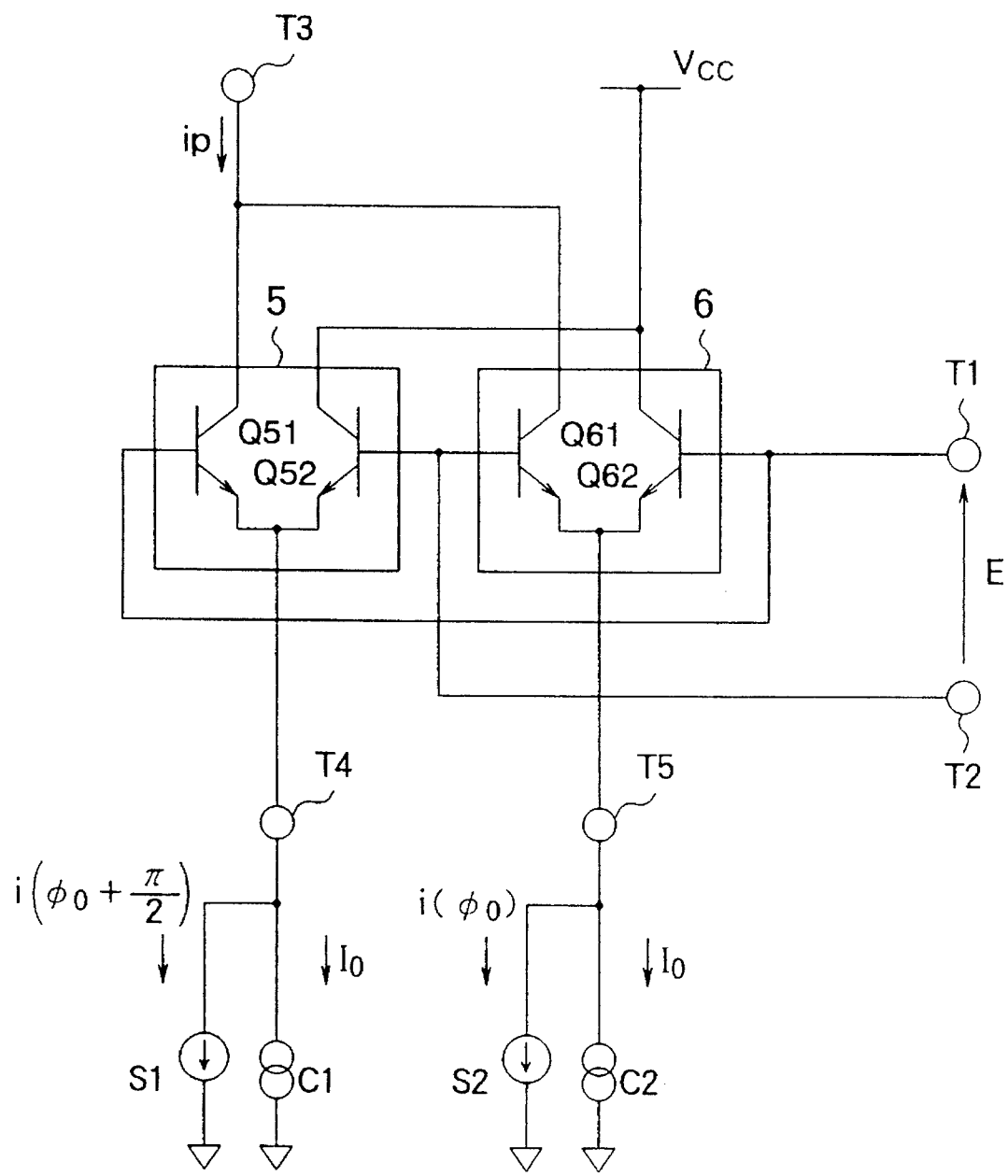
FIG. 1 is a circuit diagram showing a conventional phase control circuit.

Now, the present invention will be described with reference to the accompanying drawings. For the sake of understanding, similar components will be denoted by similar reference characters and/or reference numerals throughout the drawings.

Figure 3:
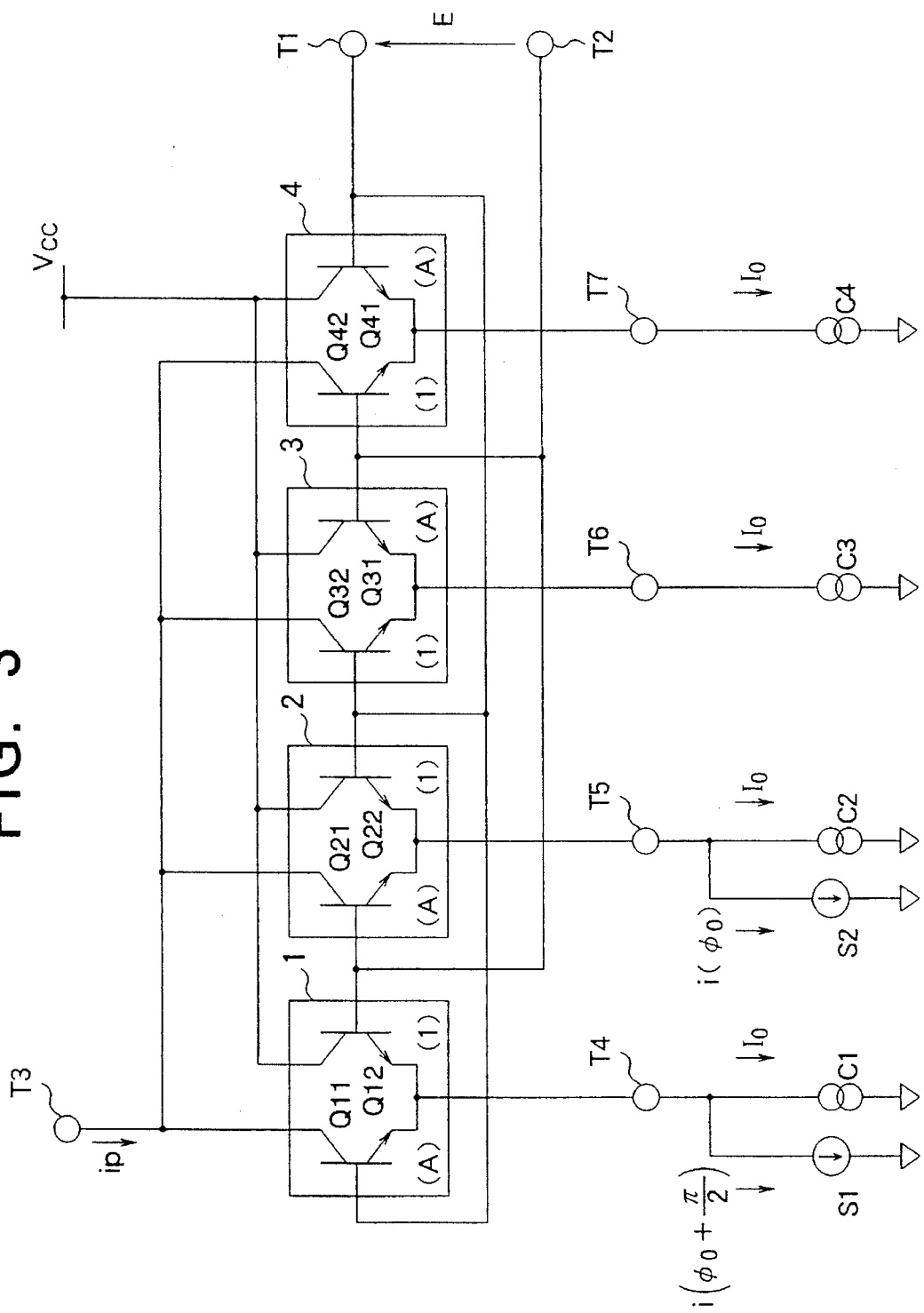
FIG. 3 is a circuit diagram showing a phase control circuit according to a first embodiment of the present invention.

Referring to FIG. 3, there is shown a phase control circuit according to a first embodiment of the present invention. The phase control circuit of the present embodiment includes four differential circuits 1, 2, 3 and 4 which are formed by respective pairs of transistors Q11 and Q12, transistors Q21 and Q22, transistors Q31 and Q32, and transistors Q41 and Q42. The ratio between the emitter areas in each pair of transistors is designed to be A:1 as shown in the drawing by (A) and (1), and the emitters of each pair of transistors are connected with each other. The coupled emitter pairs of the differential circuits 1, 2, 3, and 4 are respectively connected to constant current sources C1 through C4, each supplying constant current $I_o$ via corresponding one of terminals (current nodes) T4 through T7. Signal sources S1 and S2 are connected to terminals T4 and T5 to supply differential circuits 1 and 2 with in-quadrature phase signal $i(\phi_o + \pi/2)$ and in-phase signal $i(\phi_o)$, respectively.

The bases of transistors Q11, Q22, Q32 and Q41 are connected with each other and are connected via one of a pair of control lines to a control terminal T1, while the bases of transistors Q12, Q21, Q31 and Q42 are connected with each other and are connected via the other of the pair of control lines to a control terminal T2. The collectors of transistors Q11, Q21, Q32 and Q42 are connected with each other and are connected to an output terminal T3, while the collectors of transistors Q12, Q22, Q31 and Q41 are connected with each other and are connected to a power supply line VCC.

In operation, a control voltage E is input between control terminals T1 and T2, as is the case of the conventional circuit. That is, the control voltage E is applied between the bases of transistors Q11 and Q12, between the bases of transistors Q22 and Q21, between the bases of transistors Q32 and Q31, and between the bases of transistors Q41 and Q42. Assuming that base-to-emitter voltages of transistors Q11, Q12, Q21, Q22, Q32, Q31, Q42 and Q41 are $V_{BE11}$, $V_{BE12}$, $V_{BE21}$, $V_{BE22}$, $V_{BE32}$, $V_{BE31}$, $V_{BE42}$ and $V_{BE41}$, respectively, equations $$E = V_{BE11} - V_{BE12},$$

$$-E = V_{BE21} - V_{BE22},$$

$$E = V_{BE32} - V_{BE31},$$

$$-E = V_{BE42} - V_{BE41}$$

hold, because the emitter voltages are equal to each other in each pair of transistors Q11 and Q12, Q21 and Q22, Q31 and Q32, and Q41 and Q42, i.e., in each of differential circuits 1 through 4.

Assuming that the emitter currents and saturation currents of the base-emitter junctions of transistors Q11, Q12, Q21, Q22, Q32, Q31, Q42 and Q41 are $I_{E11}$, $I_{E12}$, $I_{E21}$, $I_{E22}$, $I_{E32}$, $I_{E31}$, $I_{E42}$ and $I_{E41}$, and $I_{S11}$, $I_{S12}$, $I_{S21}$, $I_{S22}$, $I_{S32}$, $I_{S31}$, $I_{S42}$ and $I_{S41}$, respectively, the control voltage E can be expressed after rearrangement similar to that used for obtaining equations (1) and (2) as follows:

$$E = (KT/q) \cdot \ln(I_{E11} \cdot I_{S12}/I_{E12} \cdot I_{S11}), \tag{16}$$

$$-E = (KT/q) \cdot \ln(I_{E21} \cdot I_{S22}/I_{E22} \cdot I_{S21}), \tag{17}$$

$$E = (KT/q) \cdot \ln(I_{E32} \cdot I_{S31}/I_{E31} \cdot I_{S32}), \tag{18}$$

$$-E = (KT/q) \cdot \ln(I_{E42} \cdot I_{S41}/I_{E41} \cdot I_{S42}). \tag{19}$$

Since the emitter areas of transistors Q11, Q21, Q31 and Q41 are A times the emitter areas of transistors Q12, Q22, Q32 and Q42, respectively, as described before, and the saturation currents of the base-emitter junctions of these transistors are generally proportional to the emitter areas, following equations hold:

$$I_{S11} = A \cdot I_{S12}, \quad I_{S21} = A \cdot I_{S22}, \quad I_{S31} = A \cdot I_{S32}, \text{ and } I_{S41} = A \cdot I_{S42}.$$

By using those relationships as described above, the emitter currents of respective transistors can be obtained in a manner similar to that used for obtaining equations (3) and (4) as follows:

$$I_{E11} = (\tfrac{1}{2})[1 + \tanh\{(qE/2KT) + (\tfrac{1}{2})\ln A\}](I_{E11} + I_{E12}), \tag{20}$$

$$I_{E21} = (\tfrac{1}{2})[1 - \tanh\{(qE/2KT) - (\tfrac{1}{2})\ln A\}](I_{E21} + I_{E22}), \tag{21}$$

$$I_{E32} = (\tfrac{1}{2})[1 + \tanh\{(qE/2KT) - (\tfrac{1}{2})\ln A\}](I_{E32} + I_{E31}), \tag{22}$$

$$I_{E42} = (\tfrac{1}{2})[1 - \tanh\{(qE/2KT) + (\tfrac{1}{2})\ln A\}](I_{E42} + I_{E41}). \tag{23}$$

Equations (20) through (23) show that the operating points of the differential circuits 1 through 4 with respect to a given value of the control voltage E are different to each other.

Assuming that the collector current of an arbitrary one of those transistors in the differential circuits 1 through 4, e.g. a transistor Qn, is represented by $I_{Cn}$, and the common-base current amplification factor of the transistors is designed at $\alpha$, equation $I_{Cn}=\alpha I_{En}$ hold wherein $I_{En}$ is the emitter current of transistor Qn.

Since the collectors of transistors Q11, Q21, Q32 and Q42 are connected together to output terminal T3, current ip1 flowing through terminal T3 is the sum of the collector currents of these transistors Q11, Q21, Q32 and Q42, i.e., the sum of the products of emitter currents and the current amplification factor $\alpha$. Accordingly, the output current ip1 can be obtained from equations (20) through (23) as follows:

$$\begin{aligned}
ip1 &= I_{C11} + I_{C21} + I_{C32} + I_{C42} \quad (24)\\
&= \alpha I_{E11} + \alpha I_{E21} + \alpha I_{E32} + \alpha I_{E42}\\
&= (\alpha/2)[1 + \tanh\{(qE/2KT) + (1/2)\ln A\}](I_{E11} + I_{E12}) +\\
&\quad (\alpha/2)[1 - \tanh\{(qE/2KT) - (1/2)\ln A\}](I_{E21} + I_{E22}) +\\
&\quad (\alpha/2)[1 + \tanh\{(qE/2KT) - (1/2)\ln A\}](I_{E32} + I_{E31}) +\\
&\quad (\alpha/2)[1 - \tanh\{(qE/2KT) + (1/2)\ln A\}](I_{E42} + I_{E41}).
\end{aligned}$$

Input currents of differential circuits 1 and 2, which are the sum of the emitter currents of transistors Q11 and Q12 ($I_{E11}+I_{E12}$) and the sum of the emitter currents of transistors Q21 and Q22 ($I_{E21}+I_{E22}$), respectively, are equal to the sum of the output currents of signal source S1 and constant current source C1 and the sum of the output currents of signal source S2 and constant current source C2, respectively. Similarly, input currents of differential circuits 3 and 4, which are the sum of the emitter currents of transistors Q32 and Q31 ($I_{E32}+I_{E31}$), and the sum of the emitter currents of transistors Q42 and Q41 ($I_{E42}+I_{E41}$), respectively, are equal to the output currents $I_o$ of constant current sources C3 and C4. In-quadrature phase signal s1 (s1=$i(\phi_o+\pi/2)$) and in-phase signal signal s2 (s2=$i(\phi_o)$) output from respective signal source S1 and S2 are represented by equations (6) and (7). Substituting these equations into equation (24), equation:

$$\begin{aligned}
ip1 &= (\alpha/2)[1 + \tanh\{(qE/2KT) + (1/2)\ln A\}](i_o\cos\phi_o + I_o) + \quad (25)\\
&\quad (\alpha/2)[1 - \tanh\{(qE/2KT) - (1/2)\ln A\}](i_o\sin\phi_o + I_o) +\\
&\quad (\alpha/2)[1 + \tanh\{(qE/2KT) - (1/2)\ln A\}] I_o +\\
&\quad (\alpha/2)[1 - \tanh\{(qE/2KT) + (1/2)\ln A\}] I_o
\end{aligned}$$

is obtained.

Equation (25) is modified to include a first term of $i_o$ and a second term of $I_o$, subjected to development and rearrangement using the addition formula of a hyperbolic tangential function $$\tanh(X+Y)=(\tanh X+\tanh Y)/(1+\tanh X+\tanh Y), \quad (26)$$

then further modified by introducing parameter X represented by equation (9) and by displacing the coefficients which depend on the emitter area ratio A by $\epsilon$, which is represented by:

$$\epsilon=\tanh\{(1/2)\ln A\}=(A-1)/(A+1). \quad (26)$$

As a result, the following equation (27) is obtained:

$$ip1 = (1/2)\alpha i_o(1+\epsilon)\sqrt{\{(1+X)/(1+\epsilon X)\}^2 + \{(1-X)/(1+\epsilon X)\}^2} + \quad (27)$$
$$\sin[\phi_o + \tan^{-1}\{(1-\epsilon)X/(1-X^2)\} + \pi/4] + 2\alpha I_o.$$

Now, $f_2(X)$ and $\phi_2(X)$ are defined as functions of parameters X and $\epsilon$ as follows:

$$f_2(X)=(\frac{1}{2})(1+\epsilon)[\{(1+X)/(1+\epsilon X)\}^2 + \{(1-X)/(1-eX)\}^2], \quad (28)$$

$$\phi_2(X)=\tan^{-1}\{(1-\epsilon)X/(1-\epsilon X^2)\}+\pi/4. \quad (29)$$

Then, equation (27) is rearranged as follows:

$$ip1=\alpha i_o f_2(X) \sin\{\phi_o+\phi_2(X)\}+2\alpha I_o. \quad (30)$$

In equation (30), $f_2(X)$ and $\phi_2(X)$ represent variations in the amplitude component sA and the phase component sP of output signal ip1 with respect to variation of parameter X. Since parameter $\epsilon$ is a monotonously increasing function of the emitter area ratio A as described before, $\epsilon$ increases or decreases in accordance with an increase or decrease of the emitter area ratio A. When the emitter area ratio A is greater than 0, the value of $\epsilon$ varies in the range of $-1<\epsilon<1$.

First, to check the amount of phase shift in the phase component sP with respect to variation of parameter X, $\phi_2(X)$ is differentiated with respect to X to obtain the following equation:

$$\frac{d\phi_2(X)}{dX} = \frac{1}{1+\{(1-\epsilon X)/(1-\epsilon X^2)\}} \cdot \frac{(1-\epsilon X)(1+\epsilon X^2)^2}{1-\epsilon X^2} > 0.$$

Accordingly, $\phi_2(X)$ is a monotonously increasing function of X. As apparent from equation (29), $\phi_2(X)\rightarrow\pi/2$ when $X\rightarrow 1$, and $\phi_2(X)\rightarrow 0$ when $X\rightarrow -1$. Further, values for X has one-to-one correspondence to values for E, as described before. Therefore, in the circuit according to the present embodiment, the amount of phase shift of output signal ip1 can be varied in accordance with the control voltage E in a manner similar to the conventional circuit. Moreover, since the DC component $2\alpha I_o$ contained in the output current ip1 is irrelevant to both parameters X and $\epsilon$, as is apparent from equation (30), the DC component is maintained constant regardless of the control voltage E and the emitter area ratio A.

Next, among operations of the phase control circuit according to the present embodiment, especially the effect of suppressing variation of the amplitude will be described in further detail. This effect can be obtained by setting the emitter area ratio A at a suitable value. Variation of the amplitude component is proportional to variation of $f_2(X)$ given by equation (28), and parameter $\epsilon$ in the equation is determined depending on the emitter area ratio A. Accordingly, by varying parameter X, with parameter $\epsilon$ being maintained constant, i.e., by differentiating the function $f_2(X)$ with respect to X, variation of $f_2(X)$ with respect to variation of X can be obtained, from which variation of the amplitude with respect to variation of the control voltage E can be investigated for the case in which the emitter area ratio A is set at a predetermined value. The differential equation is as follows:

$$\frac{df_2(X)}{dX} = \frac{\sqrt{2}\,(1-\epsilon^2)(3\epsilon^2-\epsilon^3)}{(1+\epsilon X^2)(1-\epsilon X^2)\sqrt{1+(\epsilon^2-4\epsilon+1)X^2+\epsilon^2 X^4}}. \quad (31)$$

-continued $$X \cdot \left( X^2 - \frac{3\epsilon - 1}{3\epsilon^2 - \epsilon^3} \right)$$

In the mean time, the amount of variation of $f_2(X)$ can be also expressed by a ratio of l.u.b. $f_2(X)$ to g.l.b. $f_2(X)$. Candidates for l.u.b. $f_2(X)$ and g.l.b. $f_2(X)$ include extremals of $f_2(X)$, and the number and values of the extremals vary depending on the value of parameter $\epsilon$, as is apparent from equation (31). Accordingly, l.u.b. $f_2(X)$ and g.l.b. $f_2(X)$ are represented by the following equations (32) and (33) the forms of which vary in accordance with the range of parameter $\epsilon$:

$$\begin{aligned} l.u.b.f_2(X) &= 1, & (-1 < \epsilon < \sqrt{2} - 1) \quad (32) \\ &= (1+\epsilon)/\sqrt{2}, & (\sqrt{2} - 1 \leq \epsilon < 1) \end{aligned}$$

$$\begin{aligned} g.u.b.f_2(X) &= (1+\epsilon)/\sqrt{2}, & (-1 < \epsilon < 1/3) \quad (33) \\ &= (1+\epsilon)\sqrt{-\epsilon^2 + 6\epsilon - 1}/4\epsilon, & (1/3 \leq \epsilon < 1). \end{aligned}$$

Figure 4:
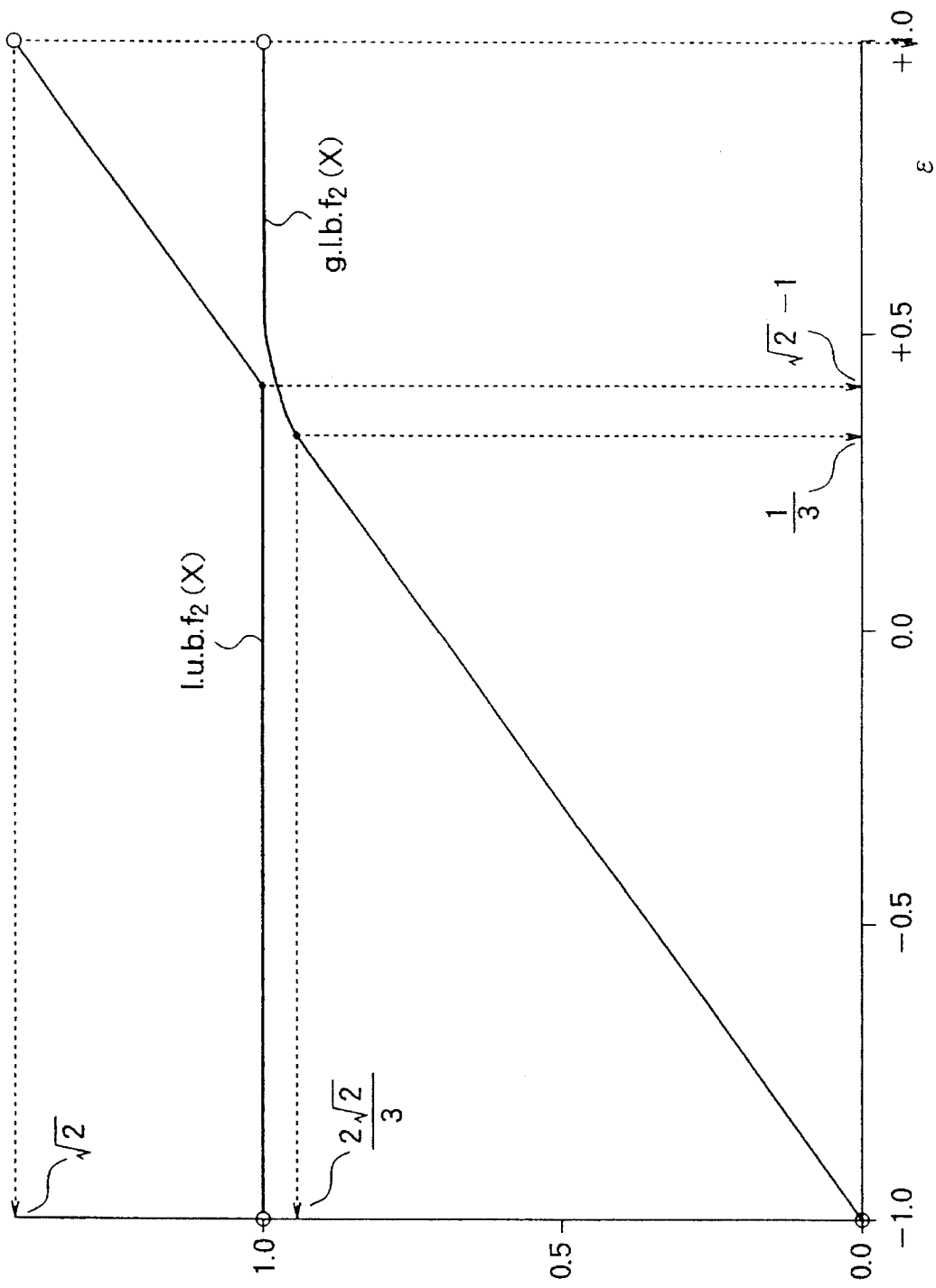
FIGS. 4 and 5 are graphs for showing operational characteristics of the phase control circuit according to the first embodiment.

Referring to FIG. 4, there is shown a graph illustrative of l.u.b. $f_2(X)$ and g.l.b. $f_2(X)$ as a function of parameter $\epsilon$. Since both the curves l.u.b. $f_2(X)$ and g.l.b. $f_2(X)$ approach each other when parameter $\epsilon$ assumes a value close to $\sqrt{2}-1$, as shown in FIG. 4, the amount of variation of $f_2(X)$ becomes small in the vicinity of $\epsilon$ at a value of $\sqrt{2}-1$. To investigate the magnitude of variation of $f_2(X)$, $r(\epsilon)$ representing a ratio of l.u.b. $f2(X)$ to g.l.b. $f2(X)$ is obtained as follows:

$$\begin{aligned} r(\epsilon) &= l.u.b.f_2(X)/g.u.b.f_2(x) & (34) \\ &= \sqrt{2}/(1+\epsilon), & (-1 < \epsilon < 1/3) \\ &= 4\epsilon/(1+\epsilon)\sqrt{-\epsilon^2 + 6\epsilon - 1}, & (1/3 \leq \epsilon \sqrt{2} - 1) \\ &= 2\sqrt{2}\,\epsilon/\sqrt{-\epsilon^2 + 6\epsilon - 1}, & (\sqrt{2} - 1 \leq \epsilon < 1). \end{aligned}$$

Figure 5:
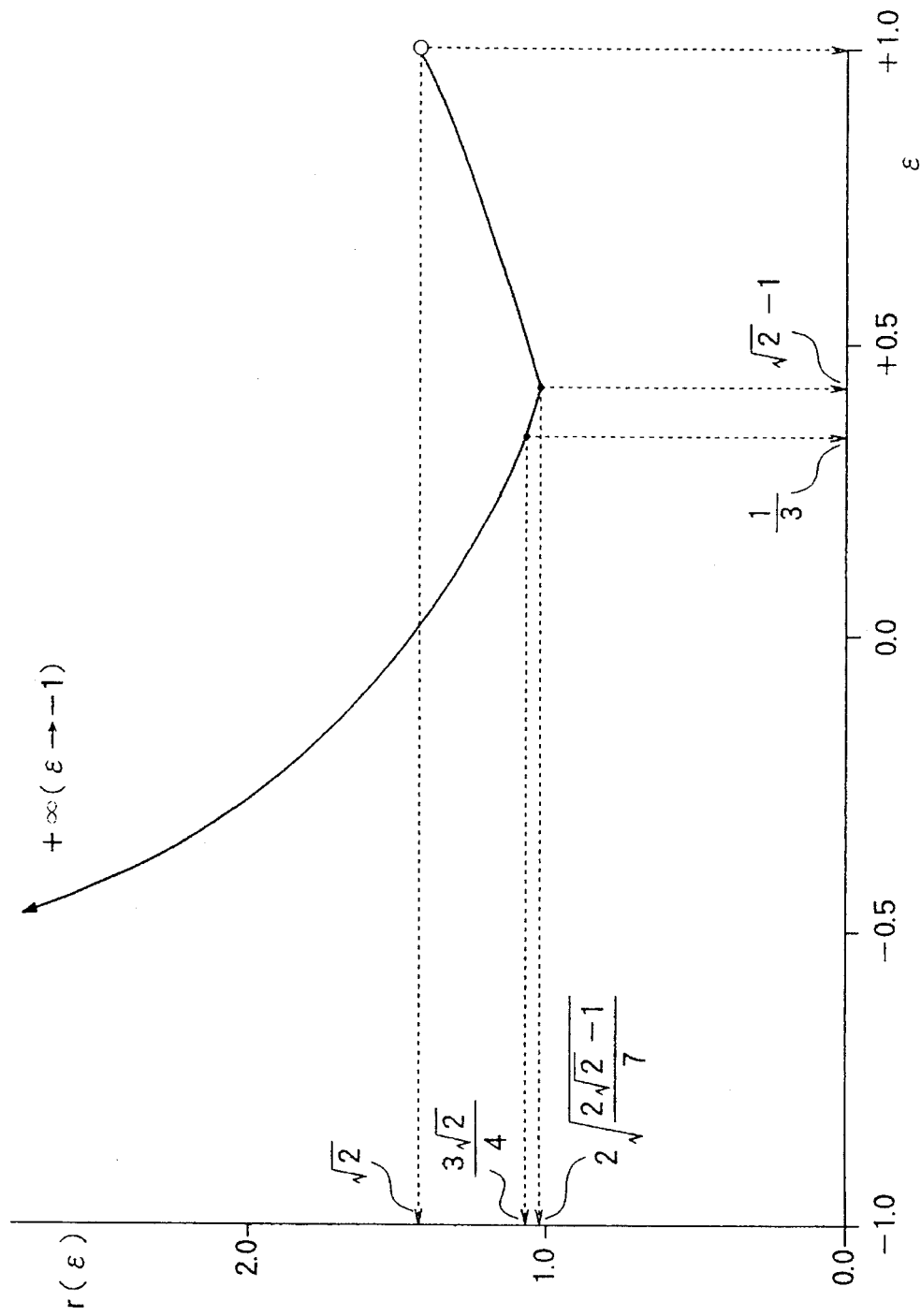

Referring to FIG. 5, there is shown a graph illustrative of $r(\epsilon)$ as a function of parameter $\epsilon$. As shown in the drawing, the function $r(\epsilon)$ assumes a minimum value $2(2\sqrt{2}-1)/7)^{1/2}=1.02216 - - -$, when $\epsilon=\sqrt{2}-1$. That is, the upper limit of the amplitude in the case where parameter $\epsilon$ is $\sqrt{2}-1$ never exceeds a value obtained by multiplying the lower limit of the amplitude by the minimum value, i.e., $1.02216 - - -$. The emitter area ratio A in this case can be calculated, based on the relationship between $\epsilon$ and A given by equation (26), as follows:

$$A = (1+\epsilon)/(1-\epsilon) = \sqrt{2} + 1 = 2.414---.$$

In the present embodiment, when the emitter area ratio A is set at $\sqrt{2}+1$, the upper limit of the amplitude component of the output signal can be made not higher than the value obtained by multiplying the lower limit of the amplitude by $1.02216 - - -$. In other words, the amount of variation in the amplitude can be made lower than about 0.02 times minimum value.

The principle of the phase control circuit according to the present embodiment may be stated qualitatively as follows: Differential circuits 1 and 2 form a multiplier circuit which provides a basic function of the phase control circuit. Variations in the amplitudes of the output currents of these differential circuits 1 and 2 which occurs during phase control is cancelled by differential circuits 3 and 4 which are added for this purpose. To accomplish the amplitude compensation, the emitter area ratio A between a pair of transistors in each differential circuit, i.e., the ratio between their ability of supplying current at the same control voltage is set at 1:A.

An integral 2 or 3 may be used as a suitable value of the emitter area ratio A, instead of the theoretically optimum value $\sqrt{2}+1$ of A which minimizes the amount of variation in the amplitude. In this case, all of the transistors implementing the phase control circuit according to the present embodiment can be formed by transistor cells designed to have an identical structure. Each of the pair of transistors in the differential circuits is formed by a single transistor cell or by a plurality of transistor cells having an identical size and connected in parallel. In the case where the emitter area ratio A is set at 2 or 3, the value of parameter $\epsilon$ is ⅓ or ½, as is given by equation (26). By substituting these values for $\epsilon$ into equation (34), the values for $r(\epsilon)$ are obtained as follows:

$$r(\tfrac{1}{3})=1.06066---,$$

$$r(\tfrac{1}{2})=1.06904---.$$

When these amounts of variation are compared with the case of the theoretically optimum value providing minimum value of $r(\epsilon)$, i.e. $1.02216 - - -$, each of them provides a satisfactory value which is only about 1.05 times the optimum value.

Figure 6:
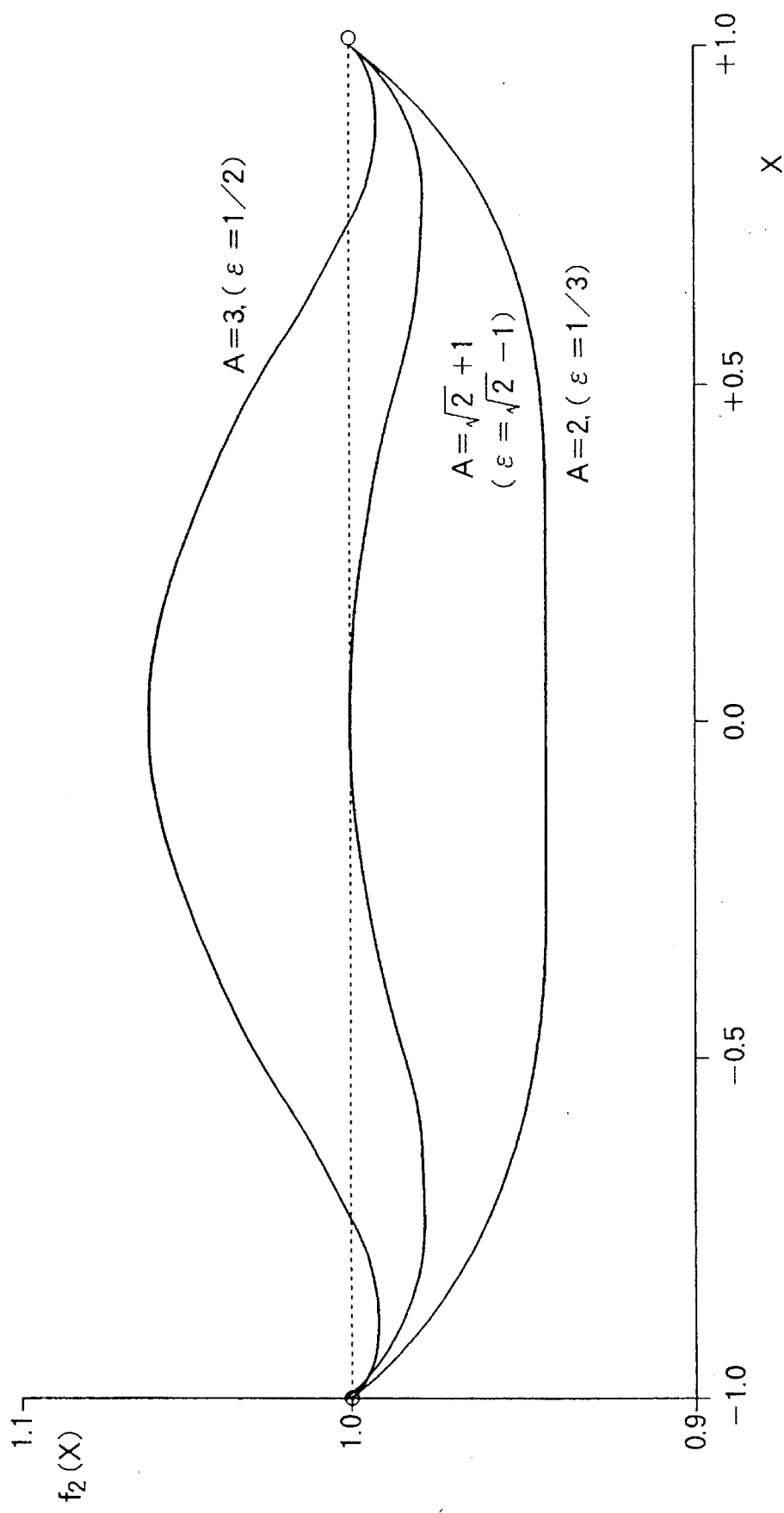
FIG. 6 is a graph showing the amplitude-variation suppressing characteristic of the phase control circuit according to the first embodiment.
Figure 7:
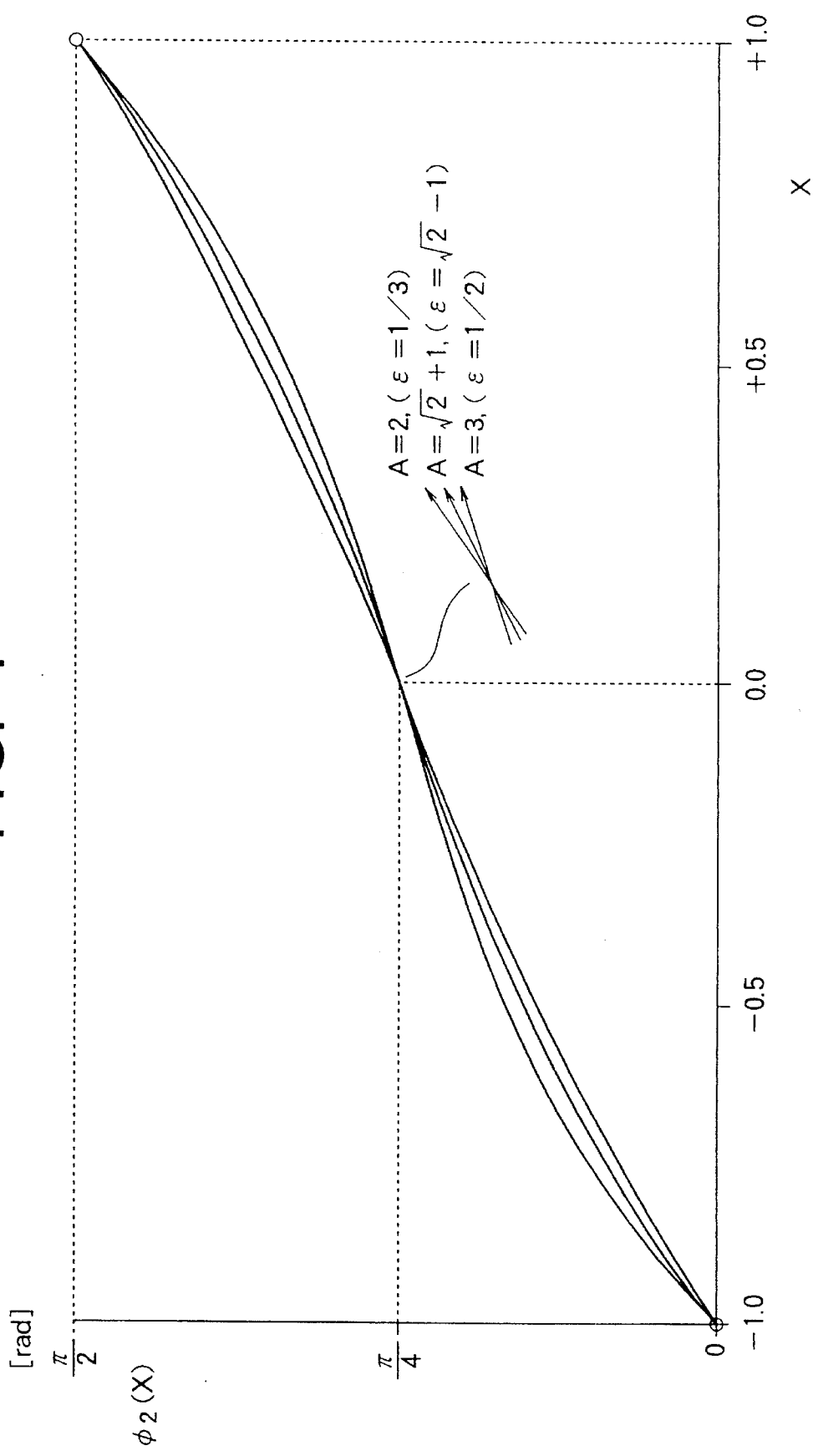
FIG. 7 is a graph showing the phase control characteristic of the phase control circuit according to the first embodiment.

FIGS. 6 and 7 show variations in the amplitude and the amount of phase shift in the cases where A is set at 2, $\sqrt{2}+1$ and 3, respectively. When A is set at 2 or 3, although the variation in the amplitude of the output signal increases as compared to the case where A is set at $\sqrt{2}+1$, the amount of the increase is very small, as shown in FIG. 6. Moreover, when A is set at 2 or 3, the amount of phase shift is varied in accordance with the control voltage in almost the same manner as in the case where A is set at $\sqrt{2}+1$, as evidenced by FIG. 7.

Figure 8:
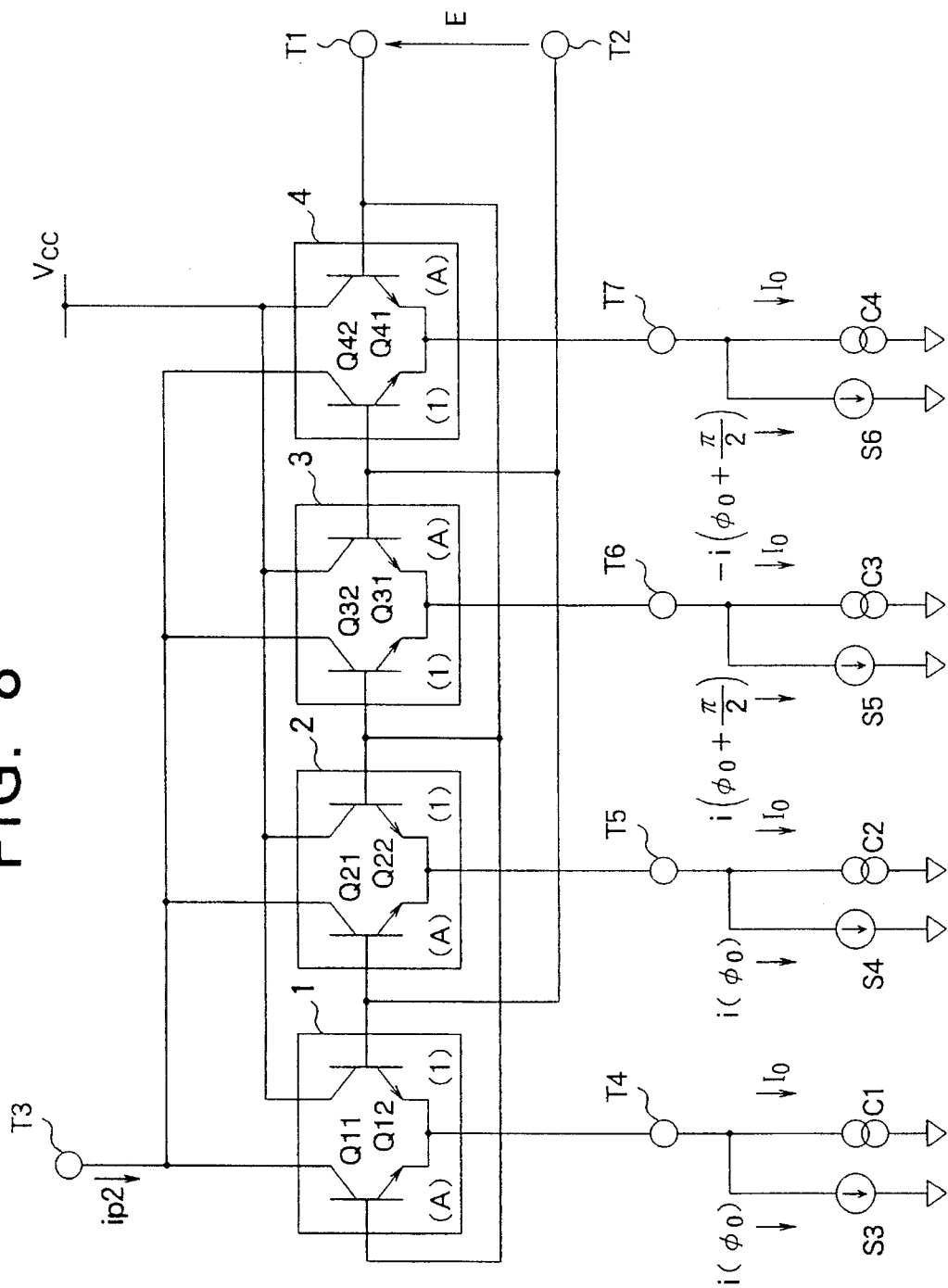
FIGS. 8 through 13 are circuit diagrams showing phase control circuits according to second through seventh embodiments of the present invention.

Referring to FIG. 8, there is shown a phase control circuit according to a second embodiment of the present invention. The phase control circuit of the present embodiment differs from the phase control circuit of the first embodiment in that four signal sources S3, S4, S5 and S6 are provided therein. That is, instead of signal sources S1 and S2 which are connected in parallel to current sources C1 and C2 so as to serve as input signal sources for differential circuits 1 and 2 in FIG. 1, signal sources S3 and S4 are provided to supply differential circuits 1 and 2 with in-phase signals $i(\phi_o)$ and $i(\phi_o)$. Also, signal sources S5 and S6 are connected in parallel to constant current sources C3 and C4 to supply differential circuits 3 and 4 with in-quadrature phase signal $i(\phi_o+\pi/2)$ and an inverted in-quadrature phase signal $-i(\phi_o+\pi/2)$, respectively.

In operation, a control voltage E is applied between control terminals T1 and T2, as in the first embodiment. However, unlike the first embodiment, differential circuits 1 and 2 are supplied with in-phase signals $i(\phi_o)$ having a reference phase through input terminals T4 and T5, while differential circuits 3 and 4 are supplied with in-quadrature phase signal $i(\phi_o+\pi/2)$ and inverted in-quadrature phase signal $-i(\phi_o+\pi/2)$} via input terminals T6 and T7 It is noted that signals $i(\phi_o+\pi/2)$ and $-i(\phi_o+\pi/2)$ are opposite in phase each other and have a phase shift of $\pi/2$ from in-phase signals $i(\phi_o)$. Other situations are same as those in the first embodiment. Accordingly, the output current ip2 of the phase control circuit according to the present embodiment can be obtained similarly to the first embodiment, and is expressed by the following equation:

$$ip2 = (\alpha/2)[1 + \tanh\{(qE/2KT) + \quad (35)$$
$$(1/2)\ln A\}]\{\sqrt{2}\ i_o\cos(\phi_o - \pi/4) + I_o\} +$$
$$(\alpha/2)[1 - \tanh\{(qE/2KT) -$$
$$(1/2)\ln A\}]\{\sqrt{2}\ i_o\sin(\phi_o - \pi/4) + I_o\} +$$
$$(\alpha/2)[1 + \tanh\{(qE/2KT) - (1/2)\ln A\}]I_o +$$
$$(\alpha/2)[1 - \tanh\{(qE/2KT) + (1/2)\ln A\}]I_o.$$

Equation (35) is equivalent to an equation which is obtained by displacing $i_o$ and $\phi_o$ in the right-hand side of equation (25), which represents the output current ip1 in the first embodiment, by $\sqrt{2}i_o$ and $\phi_o - \pi/4$, respectively.

By applying a similar displacement to equation (30) which is derived from equation (25), the following equation is obtained:

$$ip2 = \sqrt{2}\alpha i_o f_2(X) \sin\{\phi_o + \phi_2(X) - \pi/4\} + 2\alpha I_o. \quad (36)$$

As is apparent from the above displacement, equation (36) is equivalent to an equation which is obtained by multiplying the amplitude component $\alpha i_o f_2(X)$ of equation (30) by $\sqrt{2}$, and uniformly shifting the phase $\phi_2(X)$ by $-\pi/4$.

Accordingly, in the present embodiment, the variable range of the phase shift of the output signal is shifted from a range between 0 and $\pi/2$ (variable range in the first embodiment) to another range between $-\pi/4$ and $\pi/4$, and the amplitude of the output signal is $\sqrt{2}$ times that in the first embodiment. Since $f_2(X)$ representing variation in the amplitude is substantially the same as that in the first embodiment, the optimum value of the emitter area ratio A and the effect of suppressing the variation in the amplitude obtained at this state are substantially the same as those in the first embodiment. Also, the control of phase shift is carried out in almost the same manner as in the first embodiment with an exception that the phase is uniformly shifted by $-\pi/4$ in the present embodiment.

Figure 9:
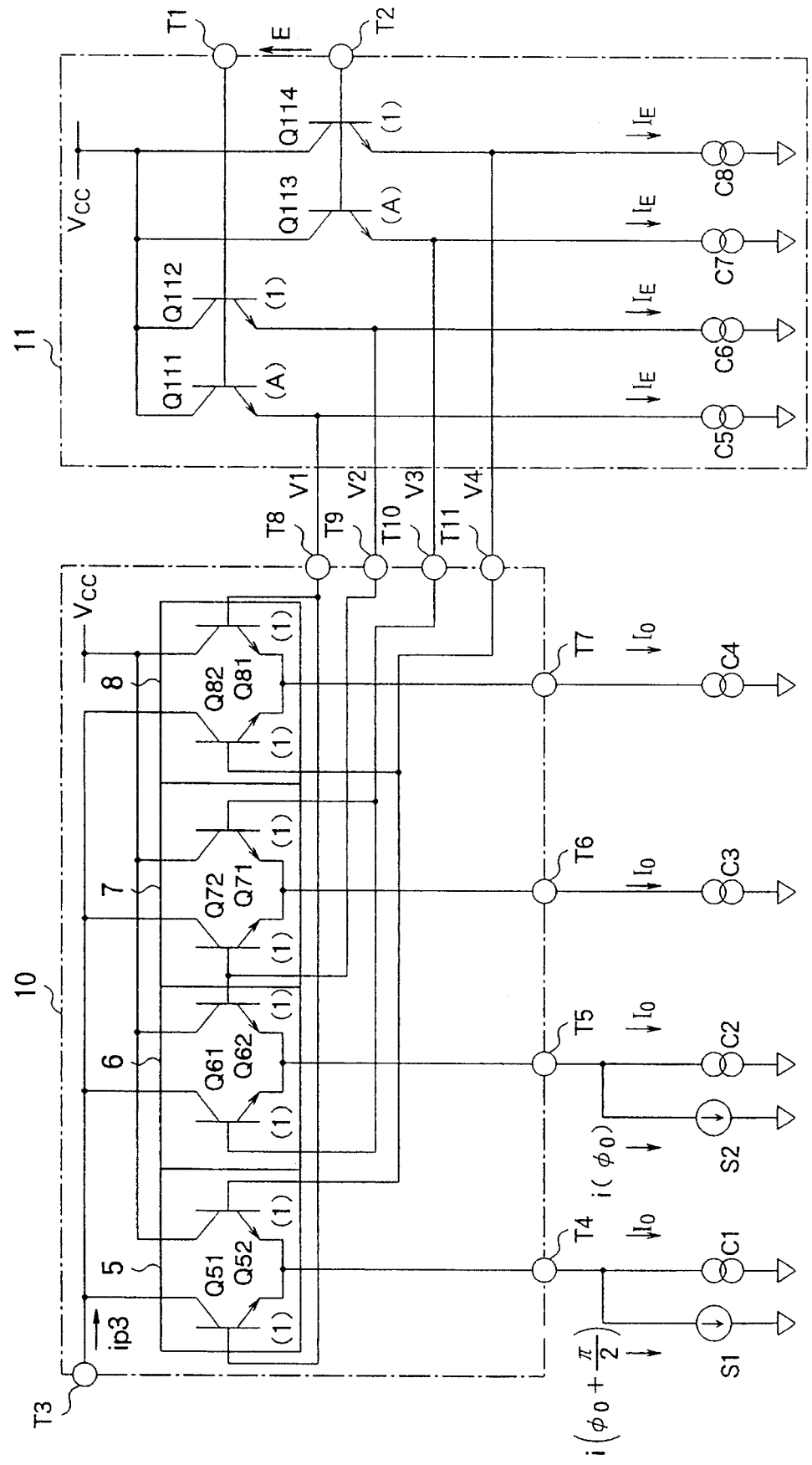

Referring now to FIG. 9, there is shown a phase control circuit according to a third embodiment of the present invention. The phase control circuit of the present embodiment differs from the circuit of the first embodiment in that, instead of differential circuits 1 through 4, differential circuit 5 through 8 are provided to form a phase shift circuit 10. The differential circuits 5 through 8 are respectively formed by pairs of transistors Q51 and Q52, transistors Q61 and Q62, transistors Q71 and Q72, and transistors Q81 and Q82 each having an identical emitter area as is the case in the conventional phase control circuit, which are shown by numerals (1) in the drawing. Also, there is provided a level shift circuit 11 which supplies differential circuits 5 through 8 with voltages V1 through V4 via terminals T8 through T11. The voltages V1 through V4 are obtained by shifting the control voltages E and –E.

The level shift circuit 11 includes transistors Q111 and Q112, transistors Q113 and Q114, and constant current sources C5 through C8 which supply transistors Q111 through Q114, respectively, with constant current $I_E$. The collectors and bases of transistors Q111 and Q112 having an emitter ratio of A:1 are connected to a power supply line VCC and a terminal T1, respectively, and voltages V1 and V2 are output from their emitter outputs. Similarly, the collectors and bases of transistors Q113 and Q114 having an emitter ratio of A:1 are connected to the power supply line VCC and a terminal T2, respectively, and voltages V3 and V4 are output from their emitter outputs.

The bases of transistors Q51 and Q81 are both connected to terminal T8 to receive voltage V1, the bases of transistors Q52 and Q82 are both connected to terminal T11 to receive voltage V4, the bases of transistors Q61 and Q71 are both connected to terminal T10 to receive voltage V3, and the bases of transistors Q62 and Q72 are both connected to terminal T9 to receive voltage V2. The collectors of transistors Q51, Q61, Q72, and Q82 are connected together to output terminal T3, while the collectors of transistors Q52, Q62, Q71 and Q81 are connected together to the power supply line VCC.

Further, similarly to the first embodiment, there are provided constant current sources C1 through C4 and signal sources S1 and S2 which are connected to differential circuits 5 through 8 via terminals T4 through T7.

In operation, transistors Q111 through Q114 in the level shift circuit 11 function as emitter followers in which voltages supplied to the bases of the transistors are shifted to have lower potentials by an amount corresponding to the base-to-emitter voltage drop of each of the transistors. Since identical constant currents $I_E$ flow from emitters of transistors Q111 through Q114 to constant current sources C5 through C8, and the emitter areas of transistors Q111 and Q113 are A times the emitter areas of transistors Q112 and Q114, the saturation currents of the base-emitter junctions of transistors Q111 and Q113 are $AI_{SE}$, where $I_{SE}$ represents the saturation currents of the base-emitter junctions of transistors Q112 and Q114. Accordingly, the base-to-emitter voltage drops of transistors Q111 through Q114 are represented as follows:

$$V_{BE111} = V_{BE113} = (KT/q)\ln(I_E/I_{SE}) - (KT/q)\ln A$$

$$V_{BE112} = V_{BE114} = (KT/q)\ln(I_E/I_{SE})$$

Since voltages obtained by inverting the polarities of the base-to-emitter voltages $V_{BE111}$ through $V_{BE114}$ represent the level shift voltages of the emitter followers formed by transistors Q111 through Q114, the amount of level shift provided by transistors Q112 and Q114 is higher than the amount of level shift provided by transistors Q111 and Q113 by a positive offset voltage corresponding to $(KT/q)\ln A$. Since a control voltage whose potential is E with respect to the potential at the bases of transistors Q112 and Q114 is supplied to the bases of the transistors Q111 and Q112, the differential voltage V1–V4 between terminals T1 and T8 is equal to a voltage obtained by adding the offset voltage to the control voltage E. Also, the differential voltage V3–V2 between terminals T9 and T10 is equal to a voltage obtained by inverting the polarity of the control voltage E and adding the offset voltage to $(KT/q)\ln A$ thereto. Accordingly, these relationships are expressed as follows:

$$V1 - V4 = E + (KT/q)\ln A,$$

$$V3 - V2 = -E + (KT/q)\ln A.$$

Since the bases of transistors Q51 and Q52 of differential circuit 5 are connected to control terminals T8 and T11, respectively, the relationships between the voltage difference between the base-to-emitter voltages $V_{BE51}$ and $V_{BE52}$ of transistors Q51 and Q52 and the voltage difference between V1 and V4 is expressed as follows:

$$V_{BE51} - V_{BE52} = V1 - V4.$$

Similarly, the relationships between the voltage differences between the base-to-emitter voltages $V_{BE61}$ and $V_{BE62}$, $V_{BE72}$ and $V_{BE71}$, and $V_{BE82}$ and $V_{BE81}$, and voltages V1–V4 are expressed as follows:

$$V_{BE61} - V_{BE62} = V2 - V3,$$

$$V_{BE72} - V_{BE71} = -(V2 - V3),$$

$V_{BE82} - V_{BE81} = -(V1-V4)$.

Since the emitter areas of transistors Q51, Q52, Q61, Q62, Q71, Q72, Q81 and Q82 are identical to each other, the saturation currents of the base-emitter junctions of these transistors are equal to each other. When the saturation current is represented by $I_{SE}$, the base-to-emitter voltage $V_{BEn}$ of transistors Qn, i. e., one of those transistors Q51, Q52, Q61, Q62, Q71, Q72, Q81, and Q82, is expressed by the equation $V_{BEn} = (KT/q)\ln(I_{En}/I_{SE})$, where $I_{En}$ represents the emitter current of transistor Qn. Using this relationship, the above-described equations are rewritten as follows to remove $I_{SE}$:

$$V1-V4 = (KT/q)\ln(I_{E51}/I_{E52}) \quad (37)$$

$$V2-V3 = (KT/q)\ln(I_{E61}/I_{E62}) \quad (38)$$

$$-(V2-V3) = (KT/q)\ln(I_{E72}/I_{E71}) \quad (39)$$

$$-(V1-V4) = (KT/q)\ln(I_{E82}/I_{E81}) \quad (40)$$

Also, when the collector current of transistor Qn is represented by $I_{Cn}$ and the common-base current amplification factor of transistor Qn is represented by $\alpha$, the relationship $I_{Cn} = \alpha I_{En}$ holds. Using this relationship and equations (37) through (40), the collector currents $I_{C51}$, $I_{C61}$, $I_{C72}$ and $I_{C82}$ of transistors Q51, Q61, Q72 and Q82 can be obtained. Accordingly, the output current ip3 of the circuit of the present embodiment, which is the sum of the above-mentioned collector currents, is expressed by the following equation:

$$\begin{aligned}ip3 &= I_{C51} + I_{C61} + I_{C72} + I_{C82} \quad (41)\\ &= (\alpha/2)[1+\tanh\{(q(V1-V4)/2KT)\}](I_{E51}+I_{E52}) + \\ & \quad (\alpha/2)[1+\tanh\{(q(V2-V3)/2KT)\}](I_{E61}+I_{E62}) + \\ & \quad (\alpha/2)[1-\tanh\{(q(V2-V3)/2KT)\}](I_{E72}+I_{E71}) + \\ & \quad (\alpha/2)[1-\tanh\{(q(V1-V4)/2KT)\}](I_{E82}+I_{E81}).\end{aligned}$$

The sums of the emitter currents of each pair of transistors in the differential circuits 5 through 8, i.e., $(I_{E51}+I_{E52})$, $(I_{E61}+I_{E62})$, $(I_{E72}+I_{E71})$ and $(I_{E82}+I_{E81})$ represent currents flowing through respective terminals T4 through T7, respectively, and are equal to the respective emitter currents of pairs of transistors of differential circuits 1 through 4 in the first embodiment. Accordingly, equation (41) can be modified and rearranged in the same manner as in the case of equation (24). As a result, the following equation (42) corresponding to equation (25) can be obtained:

$$\begin{aligned}ip3 &= (\alpha/2)[1+\tanh\{(qE/2KT)+(1/2)\ln A\}]\{i_o\cos\phi_o + I_o\} + \quad (42)\\ & \quad (\alpha/2)[1-\tanh\{(qE/2KT)-(1/2)\ln A\}](i_o\sin\phi_o + I_o) + \\ & \quad (\alpha/2)[1+\tanh\{(qE/2KT)-(1/2)\ln A\}]I_o + \\ & \quad (\alpha/2)[1-\tanh\{(qE/2KT)+(1/2)\ln A\}]I_o.\end{aligned}$$

Accordingly, the phase control characteristics and the effect of suppressing variation in amplitude in the present embodiment are identical to those in the first embodiment. In the present embodiment, each of the transistors in differential circuits 5 through 8 implementing the phase shift circuit 10 can be formed using only one transistor cell among a large number of transistor cells having an identical structure and a minimized size. With this configuration, a parasitic capacitance between the collector and base of the transistor or between the collector and the substrate can be made small in size. This removes the cause of increasing the output capacitance, thereby improving the high-frequency characteristics of the phase control circuit.

Consider that the output capacitance CA1 of the phase control circuit according to the first embodiment in which the emitter area ratio A is set at 2 or 3 and a plurality of transistor cells are used in parallel for forming each of transistors in the differential circuit, and that the output capacitance CA2 of the circuit according to the present embodiment in which all of the transistors have identical emitter area. The ratio of CA2 to CA1 is calculated as follows:

$$CA2/CA1 = 4/(2A+2) = 2/(A+1),$$

because the output capacitances CA1 and CA2 vary proportionally to the number of transistors connected to output terminal T3 in the respective embodiments. Accordingly, in case where the emitter ratio A is 2 or 3, the output capacitance of the circuit according to the present embodiment can be reduced to ⅔ or ½ as compared to the output capacitance in the first embodiment.

Figure 10:
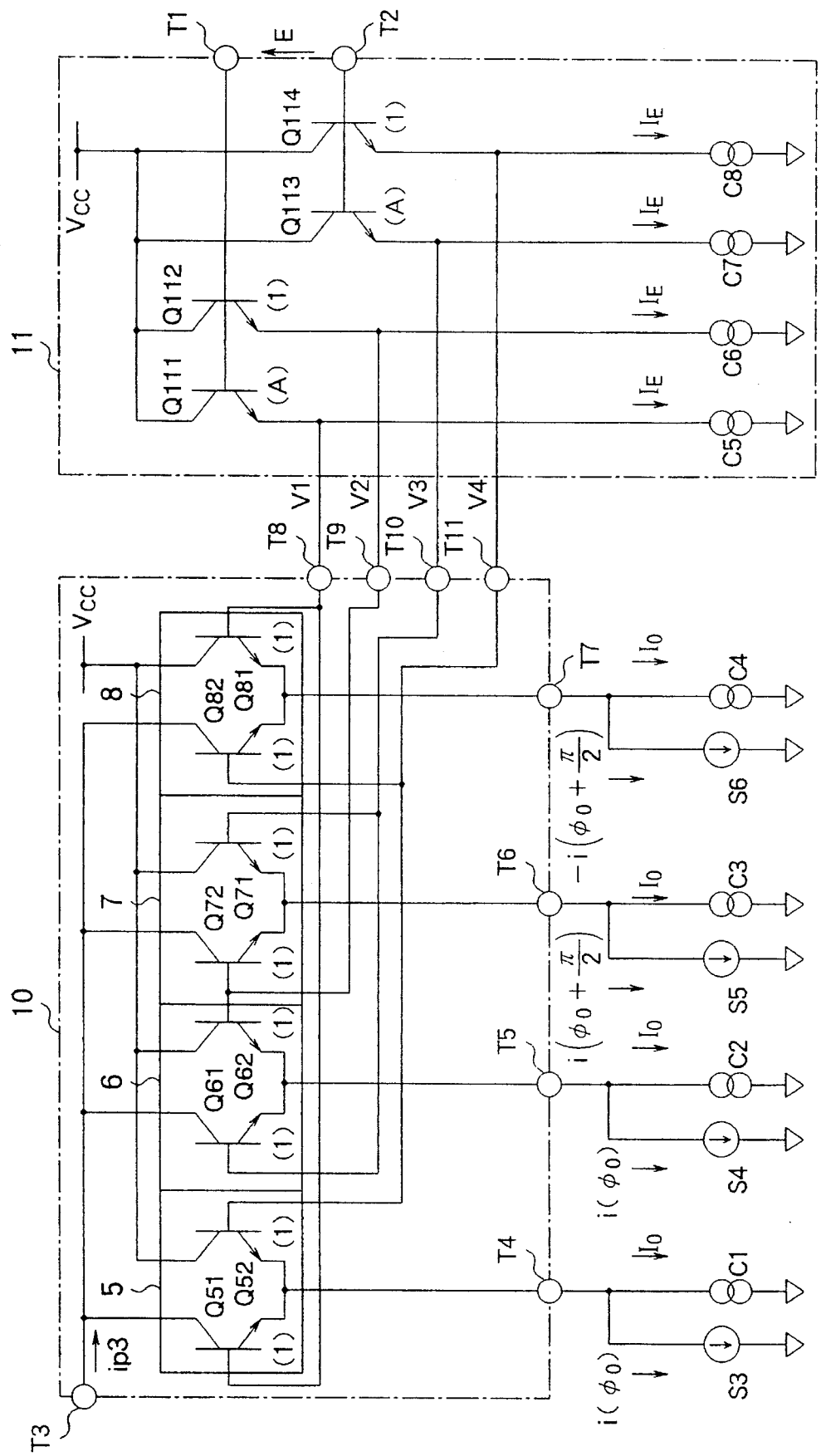

Referring to FIG. 10, there is shown a phase control circuit according to a fourth embodiment of the present invention. The phase control circuit of the present embodiment differs from the circuit of the third embodiment in that supply of input signals is modified by using four signal sources S3, S4, S5 and S6. That is, instead of signal sources S1 and S2 which are connected in parallel to current sources C1 and C2 so as to serve as input signal sources for differential circuits 5 and 6 of the phase circuit 10, signal sources S3 and S4 are provided to supply differential circuits 5 and 6 with in-phse signals $i(\phi_o)$ and $i(\phi_o)$. Also, signal sources S5 and S6 are connected in parallel to constant current sources C3 and C4 to supply differential circuits 7 and 8 with in-quadrature phase signal $i(\phi_o+\pi/2)$ and inverted in-quadrature phase signal $-i(\phi_o+\pi/2)$, respectively.

Since the basic operation of the circuit according to the present embodiment is similar to that of the circuit according to the third embodiment, the detailed description of the configuration thereof will be omitted here for avoiding a duplication. In the present embodiment, similarly to the second embodiment, the variable range of the phase of the output signal is between $\pi/4$ and $\pi/4$, whereas the variable range is between 0 and $\pi/2$ in the case of the first and third embodiments. Moreover, the amplitude of the output signal in the present embodiment is $\sqrt{2}$ times that in the first and third embodiments.

Figure 11:
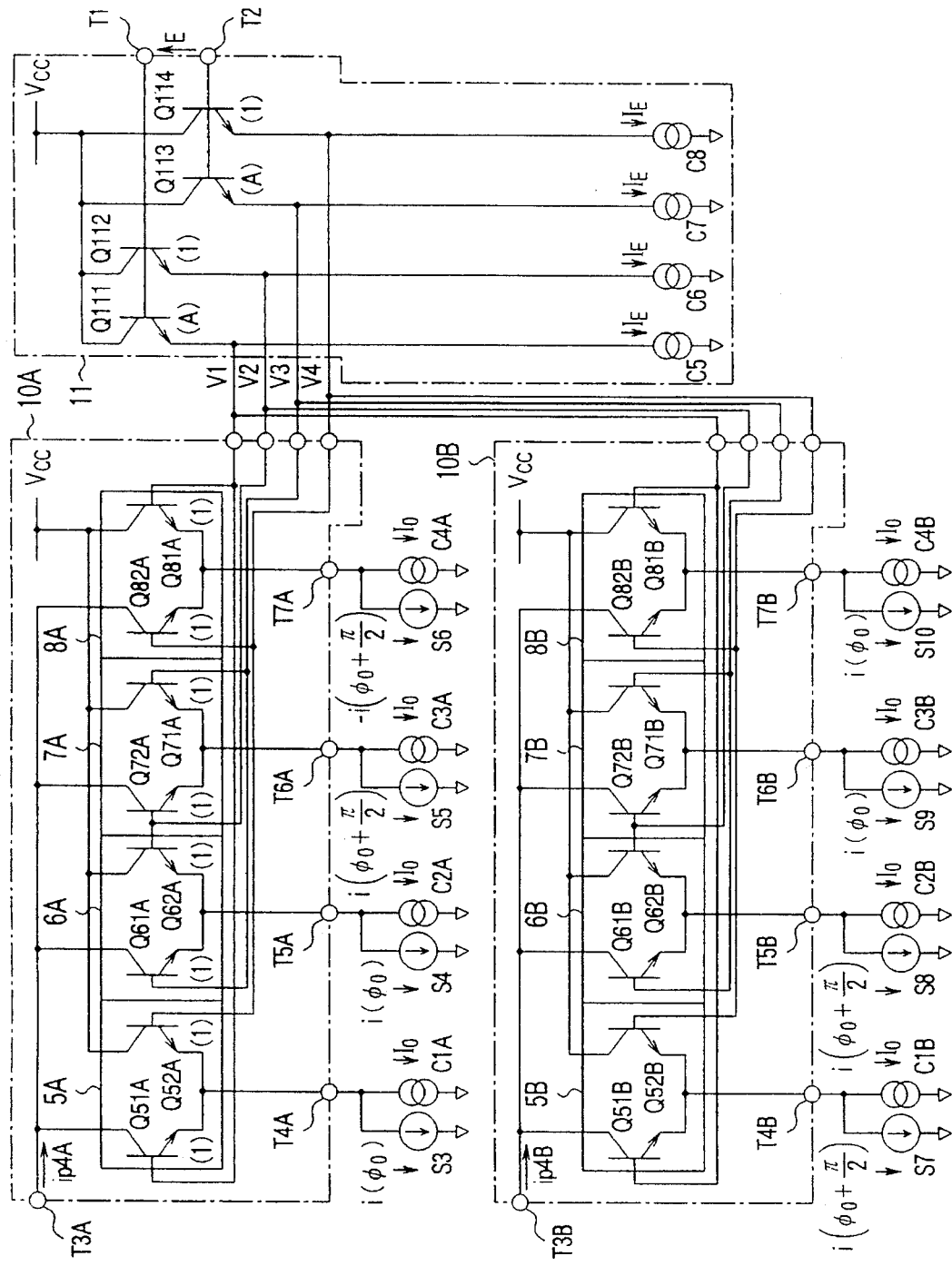

Referring to FIG. 11, there is shown a phase control circuit according to a fifth embodiment of the present invention. The phase control circuit according to the present embodiment can provide a plurality of (two in this embodiment) output signals having a phase difference of $\pi/2$ therebetween. To this end, the phase control circuit according to the present embodiment includes a plurality of phase shift circuits 10A and 10B having the same structure as that of the phase circuit 10 in the third embodiment, and a level shift circuit 11.

For differential circuits 5A and 6A of phase shift circuit 10A, signal sources S3 and S4 for supplying in-phase signals $i(\phi_o)$ and $i(\phi_o)$ are provided in parallel to constant current sources C1A and C2A, respectively, which are similar to the constant current sources in the fourth embodiment. For differential circuits 7A and 8A, signal sources S5 and S6 for supplying in-quadrature phase signal $i(\phi_o+\pi/2)$ and inverted in-quadrature phase signal $-i(\phi_o+\pi/2)$ are provided in parallel to constant current sources C3A and C4A, respectively.

For differential circuits 5B through 8B of phase shift circuit 10B, signal sources S7 through S10 are provided, in parallel to constant current sources C1B through C4B, respectively, to supply differential circuits 5B through 8B with signals $i\{\phi_o+\pi/2\}$, $i\{\phi_o+\pi/2\}$, $-i(\phi_o)$ and $i(\phi_o)$, all of which lead by $\pi/2$ from the respective output signals of signal sources S3 through S6 in FIG. 10.

In operation, signal sources S7 through S10 for phse shift circuit 10B operate to output signals which lead by π/2 from the signals output from signal sources S3 through S6 to phase shift circuit 10A. Accordingly, the amount of phase shift of the output current ip4B of phase shift circuit 10B is controlled by the control voltage E such that the phse of the output current ip4B leads by π/2 with respect to the phase of the output current ip4A.

In the present embodiment, transistors provided in the phase shift circuits 10A and 10B can be formed by transistor cells having an identical structure and a minimized size. Accordingly, in case where the circuit is implemented by a semiconductor integrated circuit, it is possible to avoid an increase of the chip area accompanied by an increase in the number of output signals. Since it is not requested that signal current be exchanged between phase shift circuits 10A and 10B, problems associated with the phase difference set other than π/2 between the signals supplied from signal sources S3 through S6 and the signals supplied from signals sources S7 through S10 will not generate during operation thereof. If the phase difference between the output signals is π/2 on the contrary, the number of transistors in the phase shift circuit can be reduced by appropriately exchanging signal currents between the two phase shift circuits 10A and 10B,.

Figure 12:
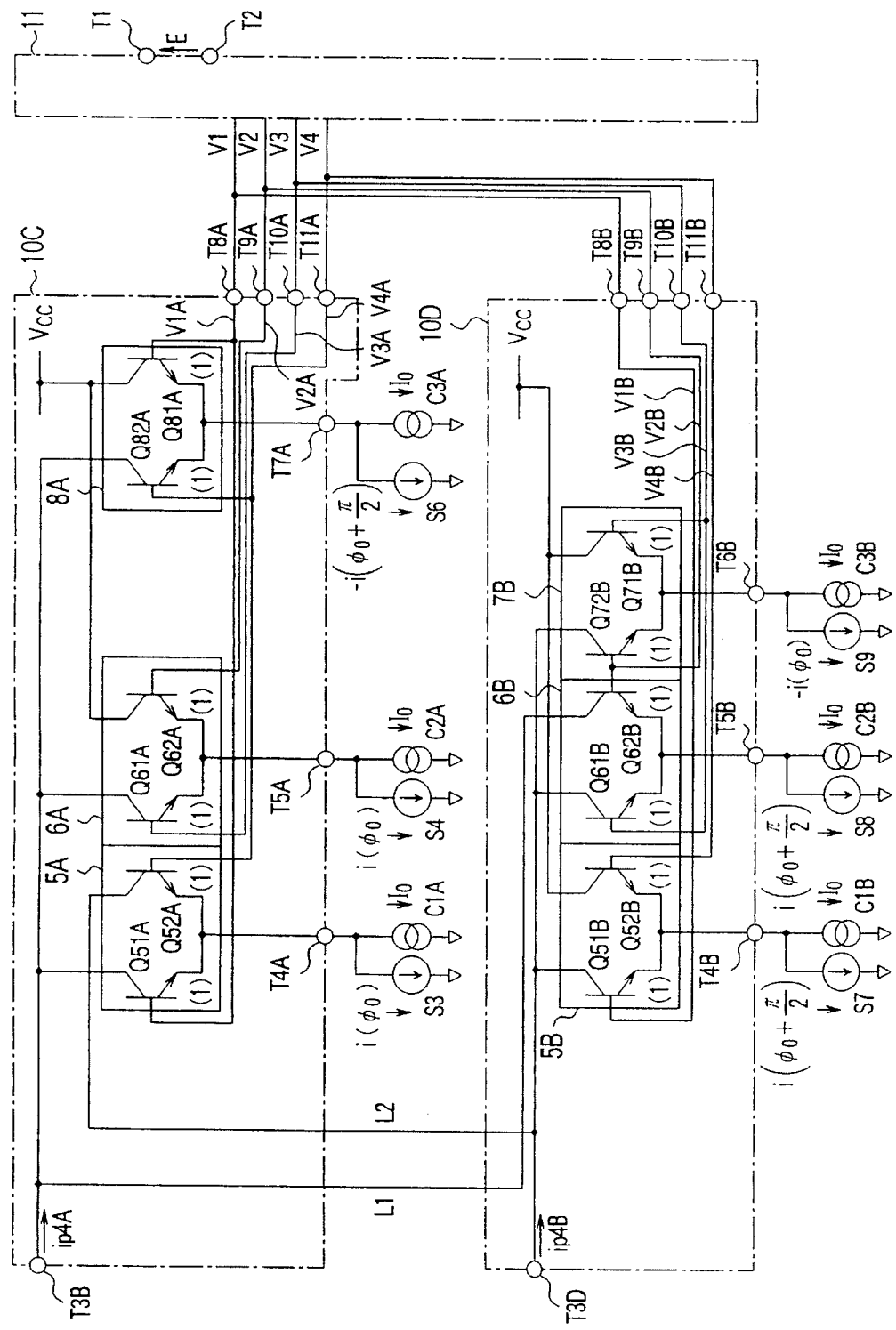

Referring to FIG. 12, there is shown a phase control circuit according to a sixth embodiment of the present invention, in which the number of transistors are reduced by exchanging signal currents. In the present embodiment, a phase shift circuit 10C is formed by removing differential circuit 7A in phase shift circuit 10A in FIG. 11, and a phase shift circuit 10D is formed by removing differential circuit 8B in phase shift circuit 10B in FIG. 11. Also, the collector of transistor Q52A of differential circuit 5A is connected to output terminal T3D through a line L2, while the collector of transistor Q62B of differential circuit 6B is connected to output terminal T3C through a line L1. Moreover, signal sources S5 and S10, and constant current sources C3A and C4B are removed.

In the phase control circuit according to the fifth embodiment, the collector current $I_{C71A}$ of transistor Q71A in phase shift circuit 10A is equal to the collector current $I_{C62B}$ of transistor Q62B in phase shift circuit 10B, while the collector current $I_{C82B}$ of transistor Q82B in phase shift circuit 10B is equal to the collector current $I_{C52A}$ of transistor Q52A in phase shift circuit 10A. In the present embodiment, taking advantage of these facts, some collector currents which would otherwise wastefully consumed are collected by connecting the collector of transistor Q62B to output terminal T3C and connecting the collector of transistor Q52A to output terminal T3D.

$I_{C71A}$, $I_{C62B}$, $I_{C82B}$ and $I_{C52A}$ are expressed by the following equations:

$$I_{C71A}=(\alpha/2)[1-\tanh\{q(V2A-V3A)/2KT\}](i_o\cos\phi_o+I_o),$$

$$I_{C62B}=(\alpha/2)[1-\tanh\{q(V2B-V3B)/2KT\}](i_o\cos\phi_o+I_o),$$

$$I_{C82B}=(\alpha/2)[1-\tanh\{q(V1B-V4B)/2KT\}](i_o\sin\phi_o+I_o),$$

$$I_{C52A}=(\alpha/2)[1-\tanh\{q(V1A-V4A)/2KT\}](i_o\sin\phi_o+I_o).$$

Since V2A−V3A=V2B−V3B, and V1A−V4A=V1B−V4B, $I_{C71A}$ is equal to $I_{C62B}$, and $I_{C82B}$ is equal to $I_{C52A}$. Accordingly, even when $I_{C62B}$ and $I_{C82B}$ are used for replacements of $I_{C71A}$ and $I_{C52A}$, the output currents ip4A and ip4B will be substantially same as those in the circuit of the fifth embodiment. Accordingly, in the present embodiment, two differential circuits, i.e., four transistors can be removed from the phase shift circuit while maintaining a similar operation to that of the fifth embodiment. Further, two input terminals can be saved due to the removal of four transistors, and the number of input signal sources and constant current sources can be saved, thereby reducing the consumption of current in the circuit.

Figure 13:
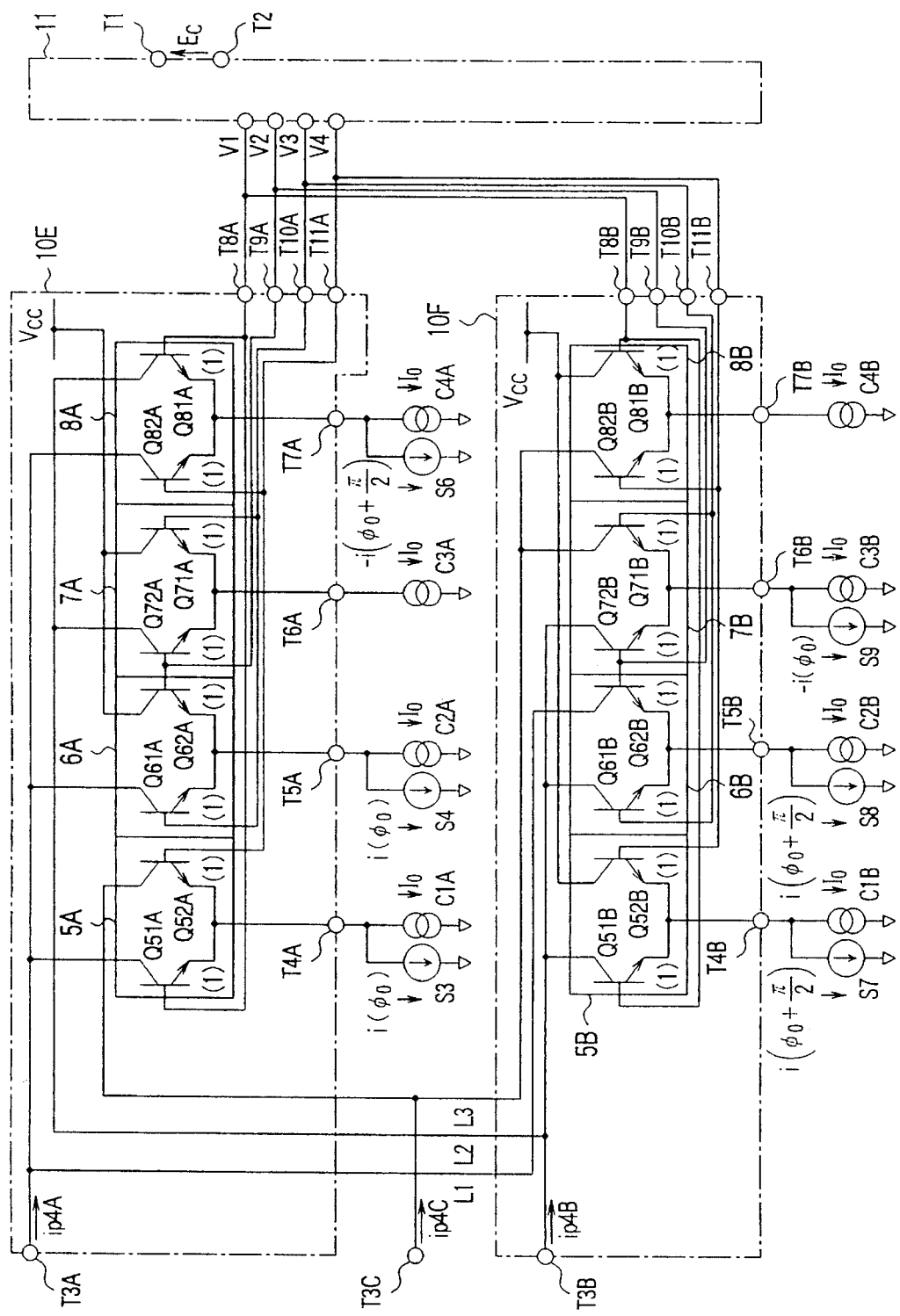

Referring to FIG. 13, there is shown a phase control circuit according to a seventh embodiment of the present invention, in which the number of output signals is further increased as compared to the fifth embodiment. The phase control circuit according to the present embodiment differs from the phase control circuit according to the fifth embodiment in that phase shift circuits 10E and 10F are provided instead of phase shift circuits 10A and 10B, that an output terminal T3C is provided to which the collector currents $I_{C72A}$ and $I_{C81A}$ of transistors Q72A and Q81A of phase shift circuit 10E, and the collector currents $I_{C71B}$ and $I_{C82B}$ of transistors Q71B and Q82B of phase shift circuit 10F are supplied to obtain the output current ip4C, and that signal sources S5 and S10 are removed.

The collector of transistor Q52A of phase circuit 10E is connected to output terminal T3B of phase circuit 10F through a line L2, similarly to the sixth embodiment. Also, the collectors of transistors Q72A and Q81A are connected together to output terminal T3C through a line L3. Moreover, the collector of transistor Q62B of phase circuit 10F is connected to output terminal T3A of phase shift circuit 10E through a line L1, similarly to the sixth embodiment. Moreover, the collectors of transistors Q71B and Q82B are connected together to output terminal T3C through the line L3.

Similarly to the sixth embodiment $I_{C72A}$, $I_{C81A}$, $I_{C71B}$ and $I_{C82B}$ are expressed by the following equations:

$$I_{C72A}=(\alpha/2)[1-\tanh\{q(V2A-V3A)/2KT\}]I_o,$$

$$I_{C81A}=(\alpha/2)[1+\tanh\{q(V1A-V4A)/2KT\}]\{-(i_o\cos O_o+I_o)\},$$

$$C_{C71B}=(\alpha/2)[1+\tanh\{q(V2B-V3B)/2KT\}]\{-(i_o\sin O_o+I_o)\},$$

$$I_{C82B}=(\alpha/2)[1-\tanh\{q(V1B-V4B)/2KT\}]I_o.$$

Equalities V1A−V4A=V1B−V4B=V1−V4, and V2A−V3A=V2B−V3B=V2−V3 hold, and the values of V1−V4 and V2−V3 are given by equations (37) and (38). Accordingly, the output current ip4C, i.e., the sum of the corrector currents of transistors Q72A, Q81A, Q71B, Q82B can be expressed by the following equation:

$$\begin{aligned}ip4C &= I_{C72A}+I_{C81A}+I_{C71B}+I_{C82B} \quad (43)\\ &= (\phi/2)[1+\tanh\{(qE/2KT)+(1/2)\ln A\}](-i_o\cos\phi_o+I_o)+\\ &\quad (\phi/2)[1-\tanh\{(qE/2KT)-(1/2)\ln A\}](-i_o\sin\phi_o+I_o)+\\ &\quad (\phi/2)[1+\tanh\{(qE/2KT)-(1/2)\ln A\}]I_o+\\ &\quad (\phi/2)[1-\tanh\{(qE/2KT)+(1/2)\ln A\}]I_o.\end{aligned}$$

Since equation (43) is equivalent to an equation obtained by replacing $i_o$ in equation (25) for the output current in the first embodiment by $-i_o$, the phase of the output current ip4C is opposite in phase, i.e., has a phase difference of π with respect to the output current ip1 represented by equation (25). Since the variable range of phase shift is between zero and π/2 in the first embodiment, the phase shift of the output current ip4C varies within the rage between π and 3π/2.

When equation (43) is modified in the same manner as in the case of modifying equation (25) to equation (30), the following equation is obtained:

$$ip4C=\alpha i_o f_2(X)\sin\{\phi_o+\phi_2(X)+\pi\}+2\alpha I_o. \quad (44)$$

The output currents ip4A and ip4B output from output terminals T3A and T3B are similar to those in the fifth and sixth embodiments. The output current ip4A is equal to the output current ip2 of the second embodiment represented by equation (36) and is expressed as follows:

$$ip4A = \sqrt{2}\alpha i_o f_2(X) \sin\{\phi_o + \phi_2(X) - \pi/4\} + 2\alpha I_o \quad (45)$$

Since the output current ip4B leads by $\pi/2$ with respect to the output current ip4A, it can be expressed as follows:

$$ip4B = \sqrt{2}\alpha i_o f_2(X) \sin\{\phi_o + \phi_2(X) + 3\pi/4\} + 2\alpha I_o \quad (46)$$

When equations (44) through (46) are compared among them, it will be clear that the phases of the output signals output from output terminals T3B and T3C are controlled to have phase differences of $\pi/2$ and $5\pi/4$ relative to the phase of the output signal from output terminal T3A.

In this embodiment, the number of input terminals can be decreased, similarly to the sixth embodiment. Also, a third output signal can be obtained which has a phase difference relative to other output signals, and the phase of the third output signal is controlled in accordance with the control signal simultaneously with other output signals.

Figure 14:
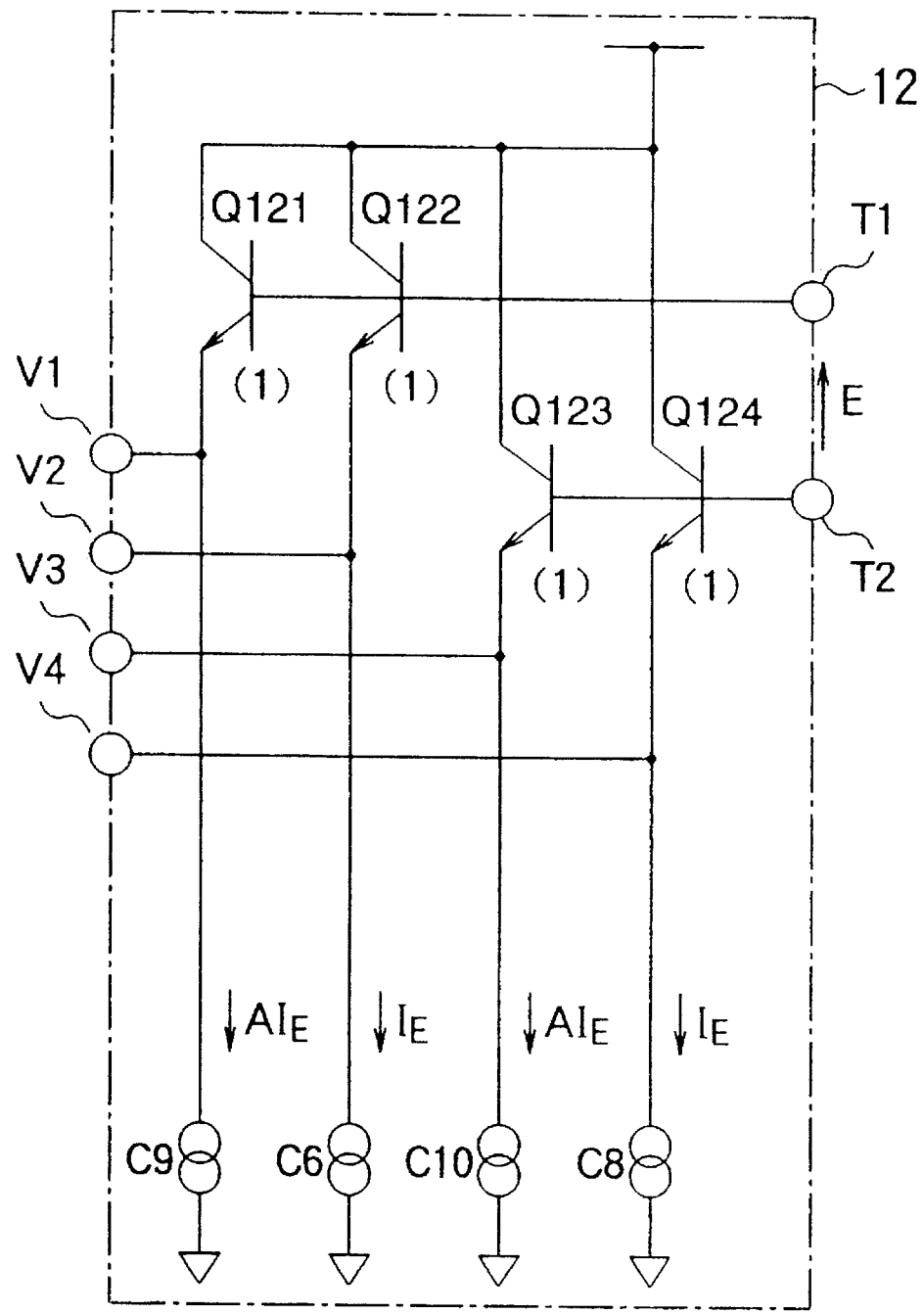
FIG. 14 is a circuit diagram showing another example of the level shift circuit.

Referring to FIG. 14, there is shown another example of the level shift circuit used in the third through seventh embodiments. The level shift circuit 12 shown in FIG. 14 is different from the level shift circuit 11 used in the third through seventh embodiments in that, instead of transistors Q111 and Q112 and transistors Q113 and Q114 each implementing an emitter follower whose emitter area ratio is 1:A in pair, transistors Q121 through Q124 having an identical emitter area are used to form respective emitter followers for outputting voltages V1 through V4, and that, instead of constant current sources C5 through C8, there are provided constant current sources C9 and C10 for supplying constant currents $AI_E$ to transistors Q121 and Q123 and constant current sources C6 and C8 for supplying constant currents $I_E$ to transistors Q122 and Q124.

The base-to-emitter voltages $V_{BE121}$ and $V_{BE123}$ of transistors Q121 and Q123 are same as $V_{BE111}$ and $V_{BE113}$ in the third embodiment, respectively, and are represented by expression $(KT/q)\ln(I_E/I_{SE}) - (KT/q)\ln A$. Also, the base-to-emitter voltages $V_{BE122}$ and $V_{BE124}$ of transistors Q122 and Q124 are same as $V_{BE112}$ and $V_{BE114}$ in the third embodiment, and are reoresebted by expression $(KT/q)\ln(I_E/I_{SE})$. Accordingly, voltages V1 through V4, and control voltages V1–V4 and V2–V3 are same as those in the third embodiment. As a result, the level shift circuit 12 functions as a complete equivalent circuit of the level shift circuit 11 to provide a similar function.

In the level shift circuit 12, identical transistors can be used for all of the transistors which form the emitter followers. Accordingly, especially in cases where the circuit is implemented by a semiconductor integrated circuit, each transistor can be formed of a single transistor cell having a minimized size, thereby reducing the chip area occupied by the level shift circuit.

Referring to FIG. 15, there is shown a phase control circuit according to an eighth embodiment of the present invention. The phase control circuit of the present embodiment differs from the third embodiment in that a load circuit 13 acting as a level shift circuit together with variable current sources M1 through M4 is provided in place of the level shift circuit 11 of FIG. 9. The load circuit 13 includes transistors Q132 and Q134 each having a unit emitter area and transistors Q131 and Q133 each having an emitter area which is A times the unit emitter area. These transistors Q131 through Q134 receive a common bias voltage Y, and output control voltages V5 through V8, respectively. Variable current sources M1 and M2 supply transistors Q131 and Q132 with variable current $(1-\mu)Ix$ which is controlled in accordance with control parameter $\mu$. Variable current sources M3 and M4 supply transistors Q133 and Q134 with variable current $\mu Ix$ which is controlled in accordance with the control parameter $\mu$ such that the direction of variation is opposite to the variation of variable current $(1-\mu)Ix$, with absolute differential coefficients of the variable currents M3 and M4 being identical to those of variable currents M1 and M2.

In operation, the control parameter $\mu$ is varied in the range of $0<\mu<1$. When the control parameter $\mu$ increases from zero to 1, the output currents from variable current sources M1 and M2 vary from Ix to zero while the output currents from variable current sources M3 and M4 vary from zero to Ix. Since the bases of transistors Q131, Q132, Q133 and Q134 are connected to a common bias input terminal T20, the base voltages of these transistors are identical to each other. Accordingly, the voltage difference V5–V8 between control voltages V5 and V8 is equal to the difference between the base-to-emitter voltages $V_{BE131}$ and $V_{BE134}$ of transistors Q131 and Q134, and the voltage difference V7–V6 between control voltages V7 and V6 is equal to the difference between the base-to-emitter voltages $V_{BE133}$ and $V_{BE132}$ of transistors Q133 and Q132. These relationships are expressed by the following equations:

$$V5-V8 = V_{BE131} \text{ and } V_{BE134},$$

$$V7-V6 = V_{BE133} \text{ and } V_{BE132}.$$

As described before, transistors Q132 and Q134 both have unit emitter areas, and transistors Q131 and Q134 have emitter areas which are A times the emitter areas of transistors Q132 and Q134. Accordingly, assuming that the saturation currents of the base-emitter junctions of transistors Q132 and Q134 are represented by $I_{SE}$, the saturation currents of the base-emitter junctions of transistors Q131 and Q133 are $AI_{SE}$. Also, the emitter currents of transistors Q131, Q132, Q133 and Q134 are $(1-\mu)Ix$, $(1-\mu)Ix$, $\mu Ix$, and $\mu Ix$, respectively. From these relationships, $V_{BE131}$, $V_{BE132}$, $V_{BE133}$ and $V_{BE134}$ can be obtained, from which $I_{SE}$ is eliminated to obtain the following equations for control voltages V5–V8 and V7–V6:

$$V5-V8 = (KT/q)\ln\{\mu/(1-\mu)\} + (KT/q)\ln A, \quad (47)$$

$$V7-V6 = -(KT/q)\ln\{\mu/(1-\mu)\} + (KT/q)\ln A. \quad (48)$$

Equations (47) and (48) are equivalent to equations obtained by displacing the control voltage E in equations (39) and (40) in the third embodiment by $(KT/q)\ln\{\mu/(1-\mu)\}$.

Accordingly, the output current ip5 of the phase control circuit according to the present embodiment can be calculated by replacing the voltage E in equation (42) for the output current ip3 of the circuit of the third embodiment. Since equations (25) and (42) for the output currents ip3 and ip1 of the circuits according to the third and first embodiments are equivalent to each other, ip5 can be obtained by effecting the displacement in equation (25) as follows:

$$ip5 = (\alpha/2)[1 + \tanh\{(1/2)\ln\{\mu/(1-\mu)\} + \qquad (49)$$
$$(1/2)\ln A\}](i_o\cos\phi_o + I_o) +$$
$$(\alpha/2)[1 - \tanh\{(1/2)\ln\{\mu/(1-\mu)\} -$$
$$(1/2)\ln A\}](i_o\sin\phi_o + I_o) +$$
$$(\alpha/2)[1 + \tanh\{(1/2)\ln\{\mu/(1-\mu)\} - (1/2)\ln A\}]I_o +$$
$$(\alpha/2)[1 - \tanh\{(1/2)\ln\{\mu/(1-\mu)\} + (1/2)\ln A\}]I_o.$$

Similarly to the first embodiment, equation (49) is modified to include a first term of $i_o$ and a second term of $I_o$. Then terms including hyperbolic tangential function are developed using the addition formula of a hyperbolic tangential function. Further, displacement by the parameter given by equation (26) is performed. The resultant equation is rewritten using the relationship $\tanh[(1/2)\ln\{\mu/(1-\mu)\}]=2\mu-1$, thereby obtaining the following equation:

$$ip5 = (1/2)\alpha i_o(1+\epsilon) \cdot \qquad (50)$$
$$\sqrt{\{(1+2\mu-1)/(1+\epsilon(2\mu-1))\}^2 + \{(1-2\mu+1)/(1+\epsilon(2\mu-1))\}^2}$$
$$\sin[\phi_o + \tan^{-1}\{(1-\epsilon)(2\mu-1)/(1-\epsilon(2\mu-1)^2)\} +$$
$$(\pi/4)] + 2\alpha I_o.$$

Equation (50) is equivalent to an equation obtained by replacing X in equation (27) in the first embodiment by $2\mu-1$.

Accordingly, by introducing the function similar to equation (30) in the first embodiment, equation (50) can be modified to obtain the following equation:

$$ip5=\alpha i_o f_2(2\mu-1) \sin\{\phi_o+\phi_2(2-\mu)\}+2\alpha I_o. \qquad (51)$$

In equation (51), $f_2(2\mu-1)$ and $\phi_2(2\mu-1)$ represent the amplitude component and the amount of phase shift, respectively, of the output signal of the phase control circuit according to the present embodiment. Accordingly, the amplitude and the amount of phase shift of the output signal can be varied using the parameter $\mu$ which controls all of the variable currents output from variable current sources M1 through M4.

Similarly to the first embodiment, the differential function of $\phi_2(2\mu-1)$ with respect to $\mu$ is a monotonously increasing function of $\mu$. Accordingly, $\phi_2(2\mu-1)$ monotonously increases from zero to $\pi/2$ as parameter $\mu$ increases from zero to 1. Since variation of parameter $\mu$ corresponds to variations of the output currents from variable current sources M1 through M4, the phase control circuit according to the present embodiment operates such that the amount of phase shift of the output signal is varied within the range between zero and $\pi/2$ in accordance with variations of the output currents from the variable current sources M1 through M4.

In the function $f_2(2\mu-1)$ representing variation in the amplitude of the output signal, since parameter $\mu$ varies in the range of $0<\mu<1$, the value $2\mu-1$ varies in the range of $-1<2\mu-1<1$. Therefore, the range of variation of $2\mu-1$ completely corresponds to the range of X, i.e., $-1<X<1$. Accordingly, the ranges of functions $f_2(2\mu-1)$ and $f_2(X)$ are complete equivalent to each other, when parameters relating to the emitter area ratio A are determined. Therefore, similarly to the first embodiment, the variation in the amplitude can be suppressed by properly setting the emitter area ratio A.

In the present embodiment, the load circuit 13 converts variable currents to control voltages including offset voltages and supplies the phase shift circuit 10 with such control voltages. This structure eliminates the necessity of separate level shift means for adding offset voltages to the control voltages, thereby simplifying the circuit.

The phase control circuit of the present embodiment is same as that of the third embodiment with an exception that the level shift circuit 11 is replaced by variable current sources M1 through M4 and the load circuit 13. Accordingly, by the modification used for modifying the third embodiment to the fourth embodiment, the range of variation of the phase shift of the output signal can be changed to a range between $-\pi/4$ and $\pi/4$.

Also, similarly to the fifth embodiment, a plurality of phase shift circuits may be provided to obtain a plurality of output signals having a phase difference therebetween.

Further, as in the level shift circuit shown in FIG. 12 in which the emitter followers are implemented by transistors having an identical emitter area, the load circuit 13 in the present embodiment may be modified such that transistors in the load circuit have an identical emitter area by employing a configuration that the bias voltages are multiplied by coefficient A instead of employing some transistors having emitter area A times as large as the unit area.

Figure 2:
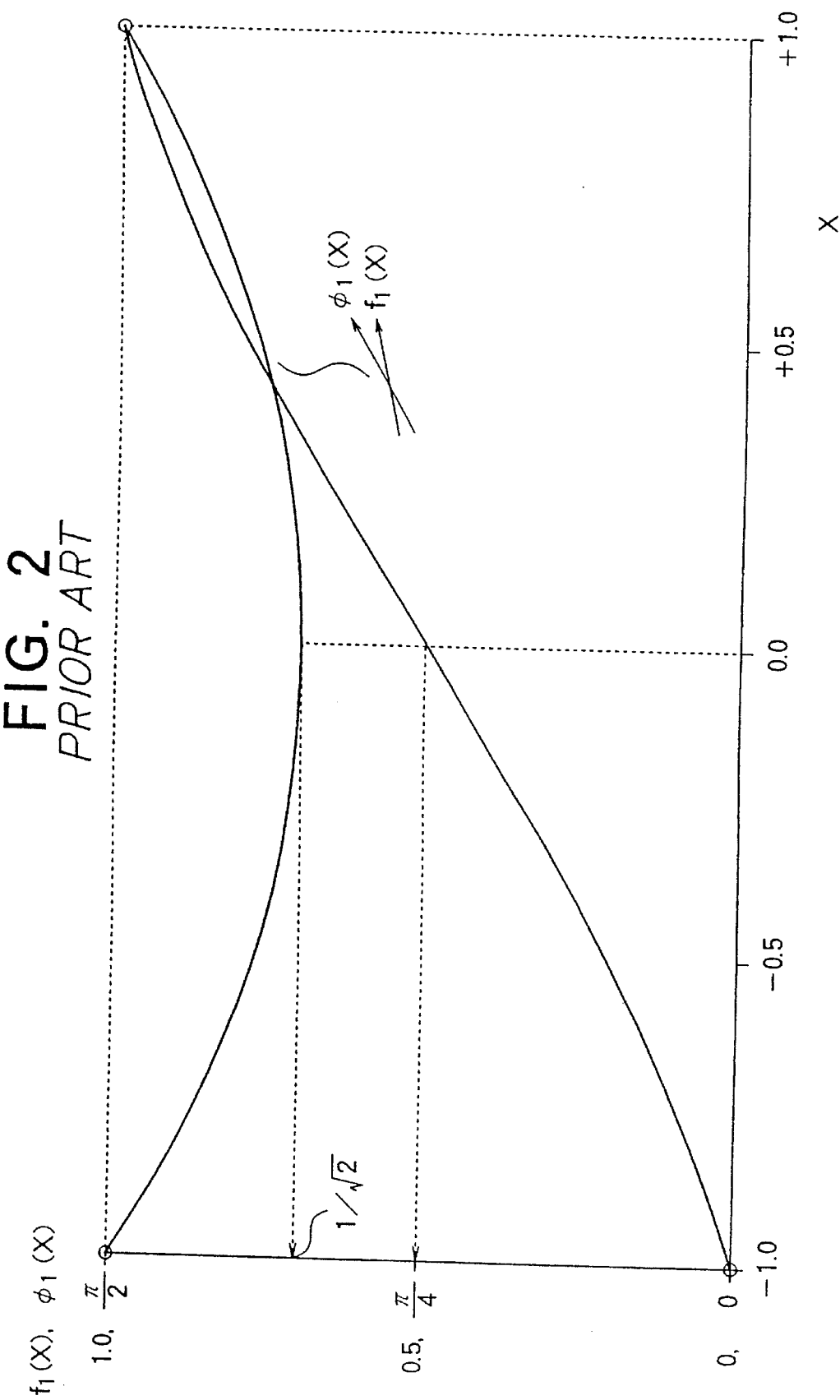
FIG. 2 is a graph showing the operational characteristics of the conventional phase control circuit.

Alternatively, the control currents may be identical by forming the load circuit including transistors having the same emitter area, and by employing a level shift circuit such as used in the third embodiment or shown in FIG. 2 to supply bias voltages having a magnitude corresponding to the coefficient A to particular transistors which must allow current to flow therethrough in an amount A times the amount of current flowing through other transistors.

What is claimed is:

1. A phase control circuit comprising:
   a first through a fourth differential circuits each having a first and a second transistors, each of said first and second transistors having an emitter, a collector and a base, said emitter of said first transistor and said emitter of said second transistor in each of said differential circuits are coupled together to form a coupled emitter pair;
   a first through a fourth current nodes, each connected to said coupled emitter pairs of corresponding one of said first through fourth differential circuits, for receiving a first through a fourth current inputs;
   a first pair of control lines for supplying a first control signal between said base of said first transistor and said base of second transistor in each of said first and fourth differential circuits;
   a second pair of control lines for supplying a second control signal between said base of said first transistor and said base of said second transistor in each of said second and third differential circuits; and
   a first output node connected to said collector of each said first transistor.

2. A phase control circuit as defined in claim 1 wherein said first control signal is opposite in phase to said second control signal and wherein a ratio of an area of said emitter of said first transistor to an area of said emitter of said second transistor being a first value more than one in each of said first through fourth differential circuit.

3. A phase control circuit as defined in claim 2 wherein said first value is set at a value between approximately 2 and approximately 3.

4. A phase control circuit as defined in claim 1 wherein each of said first through fourth current inputs includes a first constant current, and wherein said first and second current inputs further include a first signal and a second signal, respectively, said first signal and second signal having a phase difference of substantially $\pi/2$ therebetween.

5. A phase control circuit as defined in claim 1 wherein each of said first through fourth current inputs includes a first constant current, and wherein said first through fourth current inputs further include a first through fourth signals, respectively, said first and second signals having a first phase, said third signal having a second phase substantially $\pi/2$ ahead of said first phase, said fourth signal having a third phase opposite to said second phase.

6. A phase control circuit as defined in claim 1 further comprising a level shift circuit for supplying said first and second control signals to said first and second pair of control lines, respectively, said first and second control signals being opposite in phase to each other and have a first difference therebetween in amplitude.

7. A phase control circuit as defined in claim 6 wherein said level shift circuit comprises a first through a fourth emitter followers each having a base electrode, said base electrode of each of said first and second emitter followers is connected to a first control node, said base electrode of each of said third and fourth emitter followers is connected to a second control node, a third control signal is input between said first control node and said second control node, said first control signal is output from emitter outputs of said first and fourth emitter followers, said second control signal is output from emitter outputs of said second and third emitter followers, and a ratio of an area of emitter of said first emitter follower to an area of emitter of said second emitter follower and a ratio of an area of emitter of said third emitter follower to an area of emitter of said fourth emitter follower are set at a first value more than one for providing said first difference.

8. A phase control circuit as defined in claim 7 wherein said first value is set at a value between approximately 2 and approximately 3.

9. A phase control circuit as defined in claim 6 further comprising a fifth through eighth differential circuits each having a third and a fourth transistors, each of said third and fourth transistors having an emitter, a collector and a base, said emitter of said third transistor and said emitter of said fourth transistor in each of said fifth through eighth differential circuits are coupled together to form a second coupled emitter pair, and a fifth through eighth current nodes, each connected to said coupled emitter pair of corresponding one of said fifth through eighth differential circuits, for receiving a fifth through eighth current inputs, said first pair of control lines supplying said first control signal between said base of said third transistor and said base of fourth transistor in each of said fifth and eighth differential circuits, said second pair of control lines supplying said second control signal between said base of said third transistor and said base of said fourth transistor in each of said sixth and seventh differential circuits, and a second output terminal connected to said collector of each said third transistor.

10. A phase control circuit as defined in claim 6 wherein said level shift circuit comprises a first through fourth emitter followers, and a first through a fourth variable current sources for providing a first through fourth variable currents, respectively, to corresponding one of said first through fourth emitter followers, an emitter of said first and fourth emitter followers providing said first control signal, an emitter of said second and third emitter followers providing said second control signal, a ratio of each of said first and third variable currents to each of said second and fourth variable currents is set at a first value not lower than one for obtaining said first difference.

11. A phase control circuit as defined in claim 10 wherein said first value is between approximately 2 and approximately 3.

12. A phase control circuit comprising:
- a first through an eighth differential circuits each having a first and a second transistors, each of said first and second transistors having an emitter, a collector and a base, said emitter of said first transistor and said emitter of said second transistor in each of said differential circuits are coupled together to form a coupled emitter pair;
- a first through an eighth current nodes, each connected to said coupled emitter pair of corresponding one of said first through eighth differential circuits, for receiving a first through eighth current inputs;
- a first pair of control lines for supplying a first control signal between said base of said first transistor and said base of second transistor in each of said first, fourth, fifth and eighth differential circuits,
- a second pair of control lines for supplying a second control signal between said base of said first transistor and said base of second transistor in each of said second, third, sixth and seventh differential circuits,
- a first output node connected to said collector of said first transistor of each of said first, second and fourth differential circuit and to said collector of said second transistor of said sixth differential circuit,
- a second output node connected to said collector of said first transistor of each of said fifth, sixth and eighth differential circuits and to said collector of said second transistor of said sixth differential circuit,
- a third output node connected to said collector of said second transistor of said third and seventh differential circuits and said collector of said first transistor of said fourth and said eighth differential circuits.

13. A phase control circuit comprising:
- a first through a sixth differential circuits each having a first and a second transistors, each of said first and second transistors having an emitter, a collector and a base, said emitter of said first transistor and said emitter of said second transistor in each of said differential circuits are coupled together to form a coupled emitter pair,
- a first through a sixth current nodes, each connected to said coupled emitter pair of corresponding one of said first through sixth differential circuits, for receiving a first through sixth current inputs;
- a first pair of control lines for supplying a first control signal between said base of said first transistor and said base of second transistor in each of said first, third and fourth differential circuits,
- a second pair of control lines for supplying a second control signal between said base of said first transistor and said base of second transistor in each of said second, fifth and sixth differential circuits,
- a first output node connected to said collector of said first transistor of each of said first, second and third differential circuits and to said collector of said second transistor of said fifth differential circuits,
- a second output node connected to said collector of said first transistor of each of said fourth, fifth and sixth differential circuits and to said collector of said second transistor of first differential circuit.

\* \* \* \* \*